US010331354B2

(12) United States Patent
Yu et al.

(10) Patent No.: US 10,331,354 B2
(45) Date of Patent: Jun. 25, 2019

(54) STACKED MEMORY DEVICE AND A MEMORY CHIP INCLUDING THE SAME

(71) Applicant: SAMSUNG ELECTRONICS CO., LTD., Suwon-si, Gyeonggi-do (KR)

(72) Inventors: Hak-Soo Yu, Seoul (KR); Je-Min Ryu, Seoul (KR); Reum Oh, Hwaseong-si (KR); Pavan Kumar Kasibhatla, Suwon-si (KR); Seok-In Hong, Cheonan-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/617,450

(22) Filed: Jun. 8, 2017

(65) Prior Publication Data

US 2018/0032252 A1 Feb. 1, 2018

(30) Foreign Application Priority Data

Jul. 26, 2016 (KR) .................. 10-2016-0094646

(51) Int. Cl.
  *G06F 3/06* (2006.01)
  *G11C 5/02* (2006.01)
  *G11C 5/06* (2006.01)
  *G11C 5/04* (2006.01)

(52) U.S. Cl.
  CPC ............ *G06F 3/061* (2013.01); *G06F 3/0656* (2013.01); *G06F 3/0683* (2013.01); *G11C 5/02* (2013.01); *G11C 5/025* (2013.01); *G11C 5/04* (2013.01); *G11C 5/06* (2013.01); *G11C 5/063* (2013.01); *G11C 5/066* (2013.01)

(58) Field of Classification Search
  CPC ...... G06F 3/061; G06F 3/0656; G06F 3/0683; G11C 5/06; G11C 5/02
  See application file for complete search history.

(56) References Cited

U.S. PATENT DOCUMENTS

| 9,432,298 | B1* | 8/2016 | Smith | ............... H04L 49/9057 |
|---|---|---|---|---|
| 2010/0020583 | A1* | 1/2010 | Kang | ................... G11C 5/02 365/51 |
| 2011/0079923 | A1* | 4/2011 | Suh | ...................... G11C 5/02 257/777 |
| 2013/0148402 | A1* | 6/2013 | Chang | .................. G11C 8/08 365/63 |
| 2014/0181483 | A1 | 6/2014 | O'Connor et al. | |

* cited by examiner

*Primary Examiner* — Mohammed A Bashar
(74) *Attorney, Agent, or Firm* — F. Chau & Associates, LLC

(57) ABSTRACT

A stacked memory includes a logic semiconductor die, a plurality of memory semiconductor dies stacked with the logic semiconductor die, a plurality of through-silicon vias (TSVs) electrically connecting the logic semiconductor die and the memory semiconductor dies, a global processor disposed in the logic semiconductor die and configured to perform a global sub process corresponding to a portion of a data process, a plurality of local processors respectively disposed in the memory semiconductor dies and configured to perform local sub processes corresponding to other portions of the data process and a plurality of memory integrated circuits respectively disposed in the memory semiconductor dies and configured to store data associated with the data process.

19 Claims, 21 Drawing Sheets

FIG. 3

| | GP | LP | ORDER | EXAMPLE |
|---|---|---|---|---|
| CASE1 | DATA LAYOUT TRANSFORMATION | DATA REDUCTION | LP→GP | BIG DATA |
| CASE2 | COARSE PROCESSING | FINE PROCESSING | GP→LP | BIG DATA VISION RECOGNITION SEARCH ENGINE |
| CASE3 | FINE PROCESSING | COARSE PROCESSING | LP→GP | |
| CASE4 | DATA PARTITIONING | DATA CODING | GP→LP | IMAGE SENSOR |
| CASE5 | DATA COMBINING | DATA DECODING | LP→GP | DISPLAY |

STACKED MEMORY DEVICE AND A MEMORY CHIP INCLUDING THE SAME

CROSS-REFERENCE TO RELATED APPLICATION

This U.S. Non-provisional application claims priority under 35 U.S.C. § 119 to Korean Patent Application No. 10-2016-0094646, filed on Jul. 26, 2016, in the Korean Intellectual Property Office (KIPO), the disclosure of which is incorporated by reference herein in its entirety.

TECHNICAL FIELD

Exemplary embodiments of the inventive concept relate generally to semiconductor integrated circuits, and more particularly to a stacked memory device, a memory chip and a system including the stacked memory device.

DISCUSSION OF THE RELATED ART

Demands on memory capacity and operation speed of a memory device are constantly increasing. Memory bandwidth and latency are performance bottlenecks in many processing systems. Memory capacity may be increased through the use of a stacked memory device in which a plurality of semiconductor devices are stacked in a package of a memory chip. The stacked semiconductor dies may be electrically connected through the use of through-silicon vias or through-substrate vias (TSVs). Such stacking technology may increase memory capacity and also suppress bandwidth and latency penalties.

In general, a system memory device and other large-scale memories are implemented as separate from other components of a system. Each access of an external device to the stacked memory device involves data communication between the stacked semiconductor dies. In this case, inter-device bandwidth and inter-device latency penalties may occur twice for each access.

SUMMARY

According to an exemplary embodiment of the inventive concept, a stacked memory device includes a logic semiconductor die, a plurality of memory semiconductor dies stacked with the logic semiconductor die, a plurality of through-silicon vias (TSVs) electrically connecting the logic semiconductor die and the memory semiconductor dies, a global processor disposed in the logic semiconductor die and configured to perform a global sub process corresponding to a portion of a data process, a plurality of local processors respectively disposed in the memory semiconductor dies and configured to perform local sub processes corresponding to other portions of the data process and a plurality of memory integrated circuits respectively disposed in the memory semiconductor dies and configured to store data associated with the data process.

According to an exemplary embodiment of the inventive concept, a memory chip includes a base substrate, a logic semiconductor die stacked on the base substrate, a plurality of memory semiconductor dies stacked on the logic semiconductor die and a plurality of through-silicon vias (TSVs). The logic semiconductor die includes a global processor configured to perform a global sub process corresponding to a portion of a data process. The memory semiconductor dies include a plurality of local processors configured to perform local sub processes corresponding to other portions of the data process and a plurality of memory integrated circuits configured to store data associated with the data process. The TSVs electrically connect the logic semiconductor die and the memory semiconductor dies.

According to an exemplary embodiment of the inventive concept, a stacked memory device includes a logic semiconductor die including a global processor configured to perform a global sub process corresponding to a portion of a data process and a plurality of memory semiconductor dies stacked vertically. The memory semiconductor dies include a plurality of local processors configured to perform local sub processes corresponding to other portions of the data process and a plurality of memory integrated circuits configured to store data associated with the data process.

According to an exemplary embodiment of the inventive concept, a memory device includes a logic semiconductor die including a global processor configured to perform a global sub process corresponding to a first portion of a data process of an external device; and a plurality of memory semiconductor dies, wherein the memory semiconductor dies are stacked with respect to each other and a first memory semiconductor die includes a first local processor configured to perform a local sub process corresponding to a second portion of the data process.

BRIEF DESCRIPTION OF THE DRAWINGS

The above and other features of the present inventive concept will become more clearly understood by describing in detail exemplary embodiments thereof with reference to the accompanying drawings.

FIG. 3 is a diagram illustrating application examples of devices and methods according to exemplary embodiments of the inventive concept.

DETAILED DESCRIPTION OF THE EMBODIMENTS

Figure 1:
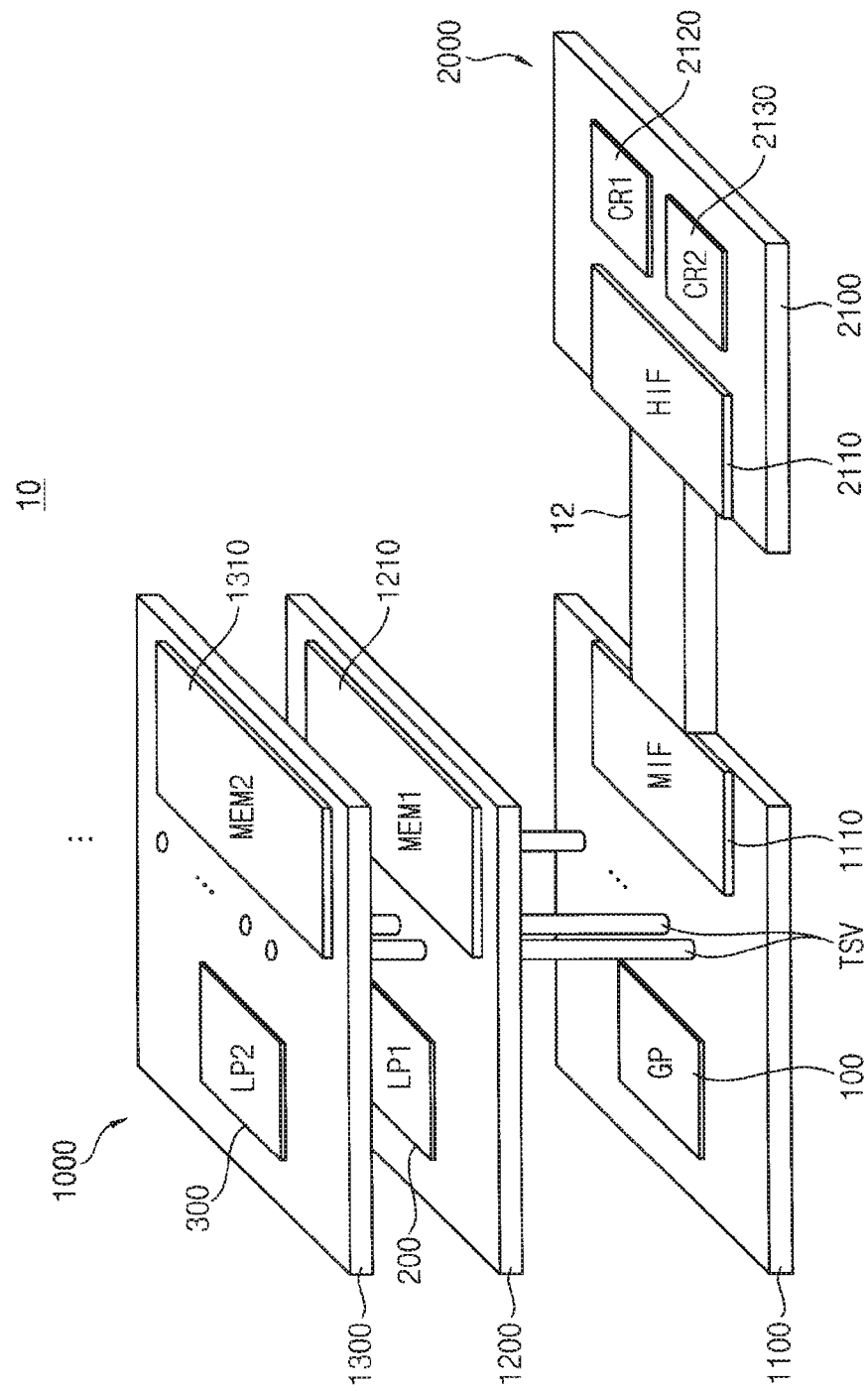
FIG. 1 is an exploded, perspective view of a system including a stacked memory device according to an exemplary embodiment of the inventive concept.

Exemplary embodiments of the inventive concept will be described more fully hereinafter with reference to the accompanying drawings. In the drawings, like numerals may refer to like elements, and thus, repeated descriptions may be omitted.

Figure 2:
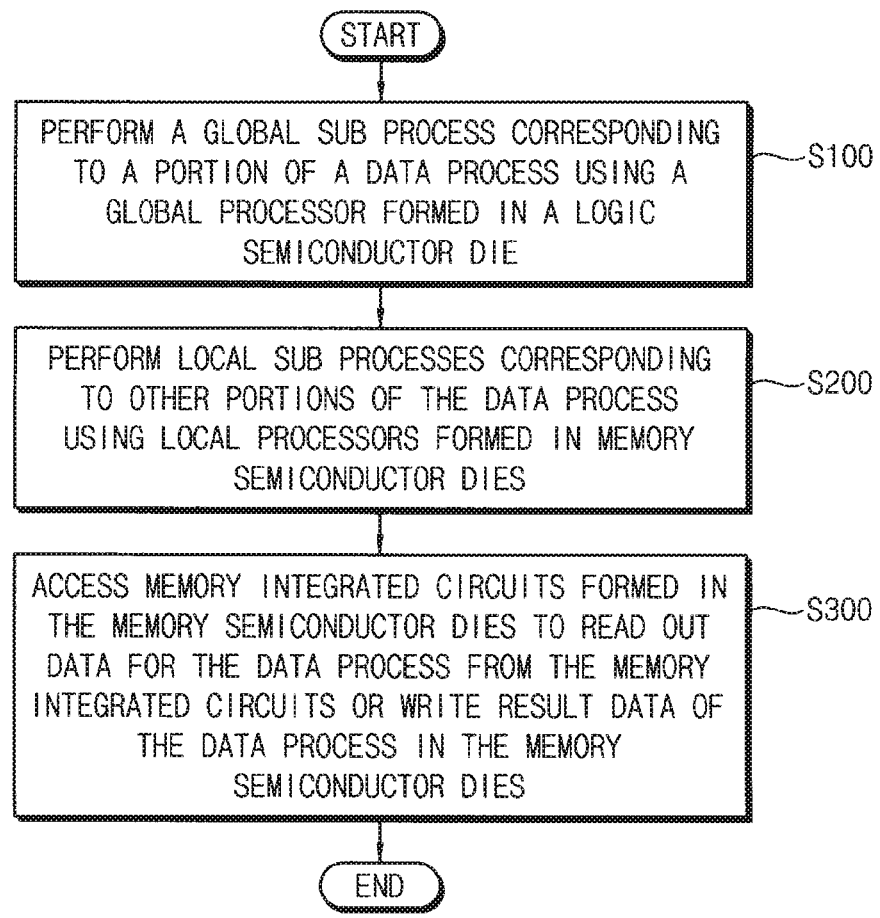
FIG. 2 is a flow chart illustrating a method of operating a stacked memory device according to an exemplary embodiment of the inventive concept.

FIG. 1 is an exploded, perspective view of a system including a stacked memory device according to an exemplary embodiment of the inventive concept, and FIG. 2 is a flow chart illustrating a method of operating a stacked memory device according to an exemplary embodiment of the inventive concept.

Referring to FIG. 1, a system 10 includes a stacked memory device 1000 and a host device 2000.

The stacked memory device 1000 may include a logic semiconductor die 1100 and a plurality of memory semiconductor dies 1200 and 1300 stacked with the logic semiconductor die 1100. FIG. 1 illustrates a non-limiting example of one logic semiconductor die and two memory semiconductor dies. In an exemplary embodiment of the inventive concept, however, two or more logic semiconductor dies and one, three or more memory semiconductor dies may be included in the stack structure. In addition, FIG. 1 illustrates a non-limiting example in that the memory semiconductor dies 1200 and 1300 are vertically stacked with the logic semiconductor die 1100. As will be described below with reference to FIG. 10, the memory semiconductor dies 1200 and 1300 except for the logic semiconductor die 1100 may be stacked vertically and the logic semiconductor die 1100 may be electrically connected to the memory semiconductor dies 1200 and 1300 through an interposer and/or a base substrate.

The logic semiconductor die 1100 may include a global processor (GP) 100 and a memory interface (MIF) 1110. The global processor 100 may perform a global sub process corresponding to a portion of a data process that is to be performed by an external device such as the host device 2000. The memory interface 1110 may perform communication with an external device such as the host device 2000 through an interconnect device 12.

The memory semiconductor dies 1200 and 1300 may include local processors 200 and 300 and memory integrated circuits 1210 and 1310, respectively. The local processors 200 and 300 may perform local sub processes corresponding to other portions of the data process. The memory integrated circuits 1210 and 1310 may store data associated with the data process.

The host device 2000 may include a host interface (HIF) 2110 and processor cores (CR1, CR2) 2120 and 2130. The host interface 2110 may perform communication with an external device such as the stacked memory device 1000 through the interconnect device 12.

FIG. 1 illustrates the processing system 10 in accordance an exemplary embodiment of the present inventive concept. The processing system 10 may include any of a variety of computing systems, including a notebook or tablet computer, a desktop computer, a server, a network router, switch, or hub, a computing-enabled cellular phone, a personal digital assistant, and the like. In FIG. 1, the processing system 10 includes the host device 2000 and the stacked memory device 1000 coupled via the interconnect device 12. The processing system 10 may also include a variety of other components, such as one or more display components, storage devices, input devices (e.g., a mouse or keyboard), and the like. In an exemplary embodiment of the inventive concept, the host device 2000 may be an integrated circuit (IC) package and the stacked memory device 1000 may be an IC package separate from the IC package of the host device 2000. In an exemplary embodiment of the inventive concept, the host device 2000 and the stacked memory device 1000 may be an IC package in which a semiconductor die of the host device 2000 and semiconductor dies of the stacked memory device 1000 are electrically connected through an interposer, and the like. It is to be understood, however, that the host device 2000 is external with reference to the stacked memory device 1000 and thus may be referred to herein as an "external device".

An exemplary embodiment of the inventive concept in which memory integrated circuits 1210 and 1310 are formed in the memory semiconductor dies 1200 and 1300 will be described below with reference to FIG. 7. The stacked memory device 1000 may be any of a variety of memory cell architectures, including, but not limited to, volatile memory architectures such as dynamic random access memory (DRAM), thyristor random access memory (TRAM) and static random access memory (SRAM), or non-volatile memory architectures, such as read-only memory (ROM), flash memory, ferroelectric RAM (FRAM), magnetoresistive RAM (MRAM), and the like.

The logic semiconductor die 1100 may include logic and other circuitry to support access to the memory integrated circuits 1210 and 1310 formed in the memory semiconductor dies 1200 and 1300. The logic and other circuitry may include the memory interface 1110, a built-in self-test (BIST) logic circuit, a memory controller, and the like. In an exemplary embodiment of the inventive concept, the memory controller may be included in the stacked memory device 1000 and the memory interface 1110 may include the memory controller. For example, the memory interface 1110 can include receivers and line drivers, memory request buffers, scheduling logic, row/column decode logic, refresh logic, data-in and data-out buffers, clock generators, and the like. In an exemplary embodiment of the inventive concept, the memory controller may be included in the host device 2000.

The stacked memory device 1000 in FIG. 1 may be implemented in a vertical stacking arrangement whereby power and signaling are transmitted between the logic semiconductor die 1100 and the memory semiconductor dies 1200 and 1300 using dense through-silicon vias (TSVs) or other vertical interconnects. Although FIG. 1 illustrates the TSVs in a set of centralized rows, the TSVs may be differently dispersed across the floorplans of the semiconductor dies 1100, 1200 and 1300.

Referring to FIGS. 1 and 2, the global processor 100 may be formed in the logic semiconductor die 1100, and a global sub process corresponding to a portion of the data process may be performed using the global processor 100 (S100). The local processors 200 and 300 may be formed in the memory semiconductor dies 1200 and 1300, and local sub processes corresponding to other portions of the data process may be performed using the local processors 200 and 300 (S200). The memory integrated circuits 1210 and 1310 may be formed in the memory semiconductor dies 1200 and 1300, and the memory integrated circuits 1210 and 1310 may be accessed to read out data for the data process from the memory integrated circuits 1210 and 1310 or write result data of the data process in the memory integrated circuits 1210 and 1310 (S300).

As such, the global processor 100 and the local processors 200 and 300 may perform the data process instead of an external device such as the host device 2000. The stacked memory device 1000 may efficiently combine process and access (e.g., read and write) of data to reduce latency and power consumption by distributing memory-intensive and data-intensive processes to the global processor 100 in the logic semiconductor die 1100 and the local processors 200 and 300 in the memory semiconductor dies 1200 and 1300. In addition, the stacked memory device 1000 may reduce bandwidth of data transferred between the stacked memory device 1000 and the host device 2000 by performing the data process, which is to be performed by the host device 2000, in the global processor 100 and the local processors 200 and 300. Furthermore, the stacked memory device 1000 may offload the data process that is to be performed by the host device 2000 so that the host device 2000 may perform other tasks rapidly, thereby increasing overall performance of the system 10.

FIG. 3 is a diagram illustrating application examples of devices and methods according to exemplary embodiments of the inventive concept.

Examples of the data process, which are performed in a dispersive manner in the stacked memory device according to exemplary embodiments of the inventive concept, are illustrated in FIG. 3. The data process is not limited to the examples of FIG. 3 and other data processes may be performed in a dispersive manner in the stacked memory device according to exemplary embodiments of the inventive concept.

Each of data processes in first through fifth cases CASE1~CASE5 in FIG. 3 may include a global sub process performed by a global processor GP and a local sub process performed by a local processor LP.

In the data process of the first case CASE1, the global sub process corresponds to data layout transformation and the local sub process corresponds to data reduction. The data layout transformation may include various processes associated with a data structure such as data gathering, data scattering, data transposition, data swapping, and the like. The data reduction may include data filtering and data cleaning to reduce a data size or data bits.

In the data process of the second case CASE2, the global sub process corresponds to coarse processing and the local sub process corresponds to fine processing. In the data process of the third case CASE3, the global sub process corresponds to fine processing and the local sub process corresponds to coarse processing. The coarse processing and the fine processing may be divided based on a size and/or a processing time of the processed data. The fine processing may require the size and/or the processing time of the processed data to be larger than those of the coarse processing.

In an exemplary embodiment of the inventive concept, the coarse processing may be a process to compare small-sized data with reference data in data/pattern matching, and the fine processing may be a process to compare large-sized data with reference data. In an exemplary embodiment of the inventive concept, the coarse processing may be the data/pattern matching to compare data with reference data, and the fine processing may be a process of a higher degree to analyze an attribute, kind, etc. of the matched data.

In the data process of the fourth case CASE4, the global sub process corresponds to data partitioning and the local sub process corresponds to data coding. In an exemplary embodiment of the inventive concept, the data partitioning may be a process of dividing frame data into data portions such as macroblocks and slices according to H.264 (or MPEG-4 Part 10, Advanced Video Coding) standards and the data coding may be a process of compressing the data portions.

In the data process of the fifth case CASE5, the global sub process corresponds to data combining and the local sub process corresponds to data decoding. In an exemplary embodiment of the inventive concept, the data decoding may be a process of decompressing the compressed data and the data combining may be a process of generating the frame data by combing a plurality of decompressed data portions.

As illustrated in the order column of FIG. 3, the local sub process may be performed in advance and then the global sub process may be performed (LP→GP), and the global sub process may be performed in advance and then the local sub process may be performed (GP→LP). In addition, the local sub process may be interleaved between portions of the global sub process or the global sub process may be interleaved between portions of the local sub process. As such, the order of the global sub process and the local sub process to form a single data process may be determined variously depending on a kind of the data process.

The dispersive performance of the data process by the global processor and the local processor may be used in various fields illustrated in the example column such as big data, vision recognition, search engine, signal processing in an image sensor, signal processing in a display device, and the like.

Figure 4A:
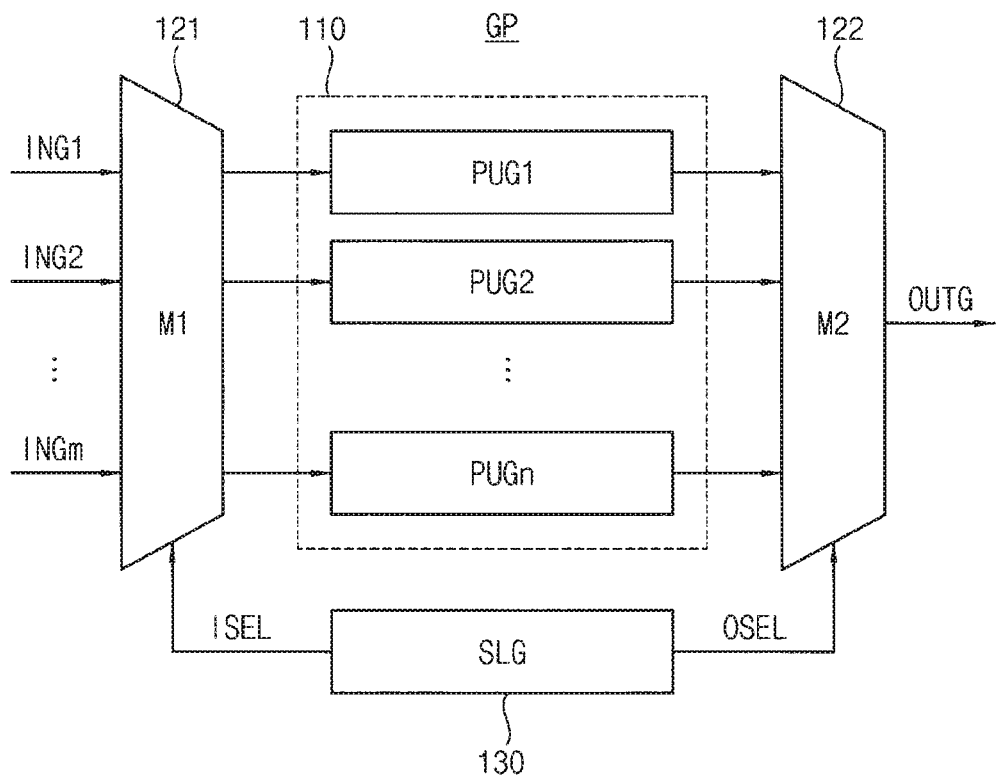
FIG. 4A is a diagram illustrating a global processor of a logic semiconductor die in the stacked memory device of FIG. 1, according to an exemplary embodiment of the inventive concept.

FIG. 4A is a diagram illustrating a global processor of a logic semiconductor die in the stacked memory device of FIG. 1 according to an exemplary embodiment of the inventive concept.

In an exemplary embodiment of the inventive concept, the global sub process performed by the global processor may be changed depending on a kind of the data process. An example configuration for such change of the global sub process is illustrated in FIG. 4A.

Referring to FIG. 4A, a global processor GP may include a plurality of processing units (PUG1~PUGn) 110, an input selector (M1) 121, an output selector (M2) 122 and a selection logic or selection controller (SLG) 130. The processing units 110 may be configured to perform different processes. The input selector 121 may select one of input signals ING1~INGm as an input of the processing units 110 in response to a first selection signal ISEL. The output selector 122 may select one of outputs of the processing units 110 as an output signal OUTG in response to a second selection signal OSEL. The selection controller 130 may generate the first selection signal ISEL and the second selection signal ISEL based on the kind of the data process. According to an exemplary embodiment of the inventive concept, at least one of the input selector 121 and the output selector 122 may be omitted.

Using such global processor GP, variable global sub process may be provided and thus various data process may be performed.

Figure 4B:
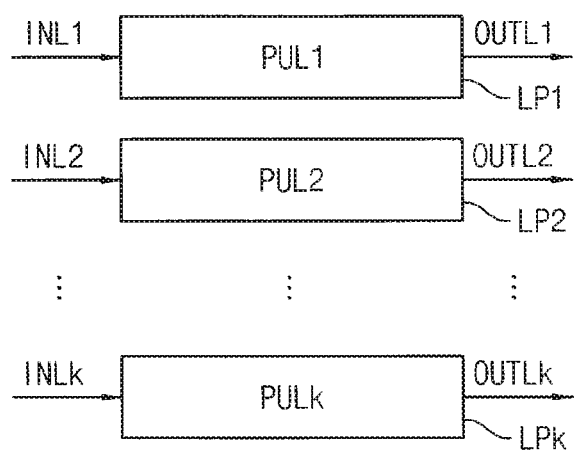
FIG. 4B is a diagram illustrating local processors of memory semiconductor dies in the stacked memory device of FIG. 1, according to an exemplary embodiment of the inventive concept.

FIG. 4B is a diagram illustrating local processors of memory semiconductor dies in the stacked memory device of FIG. 1 according to an exemplary embodiment of the inventive concept. FIG. 4B illustrates k local processors included one-by-one in k memory semiconductor dies where k is a positive integer greater than one.

Referring to FIG. 4B, local processors LP1~LPk may include one of the processing units PUL1~PULk, respectively. In other words, the first local processor LP1 includes the first processing unit PUL1, the second local processor LP2 includes the second processing unit PUL2, and in this way the last local processor LPk includes the last processing unit PULk. The first through k-th processing units PUL1~PULk may provide output signals OUTL1~OUTLk, which are results of local sub processes based on input signals INL1~INLk.

Each local sub process performed by each local processor LPi (i=1~k) may be fixed regardless of a kind of the data process. In other words, each local processor LPi may include a single processing unit PULi and the configuration of the processing unit PULi may be fixed.

In an exemplary embodiment of the inventive concept, at least two processes of the local processes performed by the local processors LP1~LPi may be equal to each other. In other words, at least two processing units of the k processing units PUL1~PULk may have the same configuration. In an exemplary embodiment of the inventive concept, at least two processes of the local processes performed by the local processors LP1~LPk may be performed simultaneously.

For example, in FIG. 1, the first local processor LP1 of the first memory semiconductor die 1200 and the second local processor LP2 of the second memory semiconductor die 1300 may have the same configuration to perform data/pattern matching, respectively. The first local processor LP1 may perform data/pattern matching with respect to data stored in the first memory integrated circuit MEM1 and, independently, the second local processor LP2 may perform data/pattern matching with respect to data stored in the second memory integrated circuit MEM2, Only the results of the first and second data/pattern matches may be provided to the global processor GP of the logic semiconductor die 1100. Using the local processors and the memory integrated circuits respectively formed in the same layers, the local processes may be performed simultaneously, thereby reducing an overall processing time and power consumption In an exemplary embodiment of the inventive concept, at least two processes of the local processes performed by the local processors LP1~LPk may be different from each other.

For example, in FIG. 1, the first local processor LP1 of the first memory semiconductor die 1200 may have a configuration to perform management of the stacked memory device 1000 and the second local processor LP2 of the second memory semiconductor die 1300 may have a configuration to perform data/pattern matching. In this case, the first memory integrated circuit MEM1 may store meta data used for the management of the stacked memory device 1000 and the second memory integrated circuit MEM2 may store data for the data process. When the management of the stacked memory device 1000 is performed, the global processor GP of FIG. 4A may select one corresponding unit of the processing units PUG1~PUGn and the global processor GP and the first local processor LP1 may dispersively perform the management of the stacked memory device 1000. When the data process such as the data/pattern matching is performed, the global processor GP of FIG. 4A may select one corresponding unit of the processing units PUG1~PUGn and the global processor GP and the second local processor LP2 may dispersively perform the data process.

Figure 5:
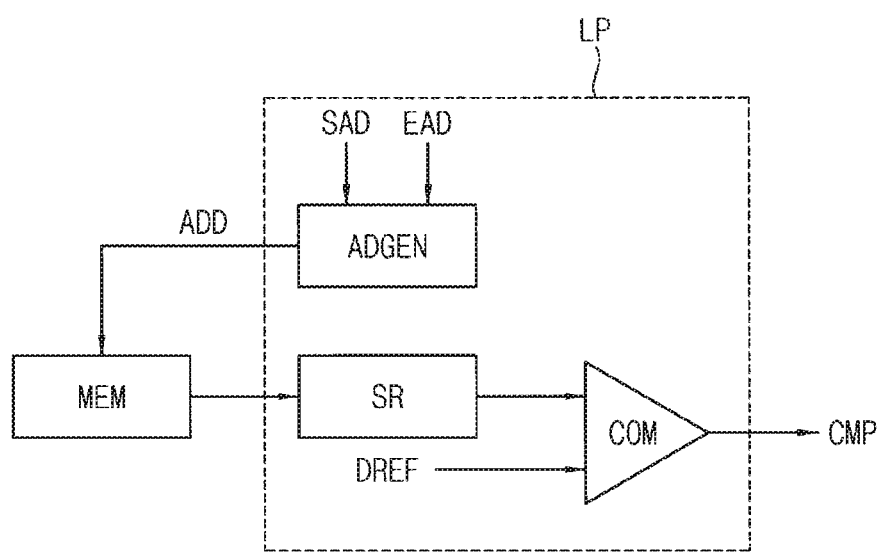
FIG. 5 is a block diagram illustrating a local processor of a memory semiconductor die in the stacked memory device of FIG. 1, according to an exemplary embodiment of the inventive concept.

FIG. 5 is a block diagram illustrating a local processor of a memory semiconductor die in the stacked memory device of FIG. 1 according to an exemplary embodiment of the inventive concept.

Referring to FIG. 5, a local processor LP may include a comparator COM configured to compare reference data DREF and read data provided from a corresponding memory integrated circuit MEM in response to a read address ADD. The local processor LP may further include a shift register SR configured to sequentially shift bits of the read data when the bit number of the read data is larger than the bit number of the reference data DREF. Using the shift register SR, it is detected whether the read data includes the same data/pattern as the reference data DREF.

In an exemplary embodiment of the inventive concept, the local processor LP may further include an address generator ADGEN configured to generate a read address ADD that is sequentially increasing or decreasing. For example, the address generator ADGEN may determine a range of data/pattern matching based on a start address SAD and an end address EAD provided from the global processor GP. The local processor LP of FIG. 5 may be formed in the same memory semiconductor die as the memory integrated circuit MEM. In this case, frequent exchange of data and/or control signals between the semiconductor dies may be omitted. The address and the data may be provided in the same memory semiconductor die (by virtue of the address generator ADGEN in the local processor LP) to reduce the bandwidth, and thus, power consumption may be reduced.

Figure 6:
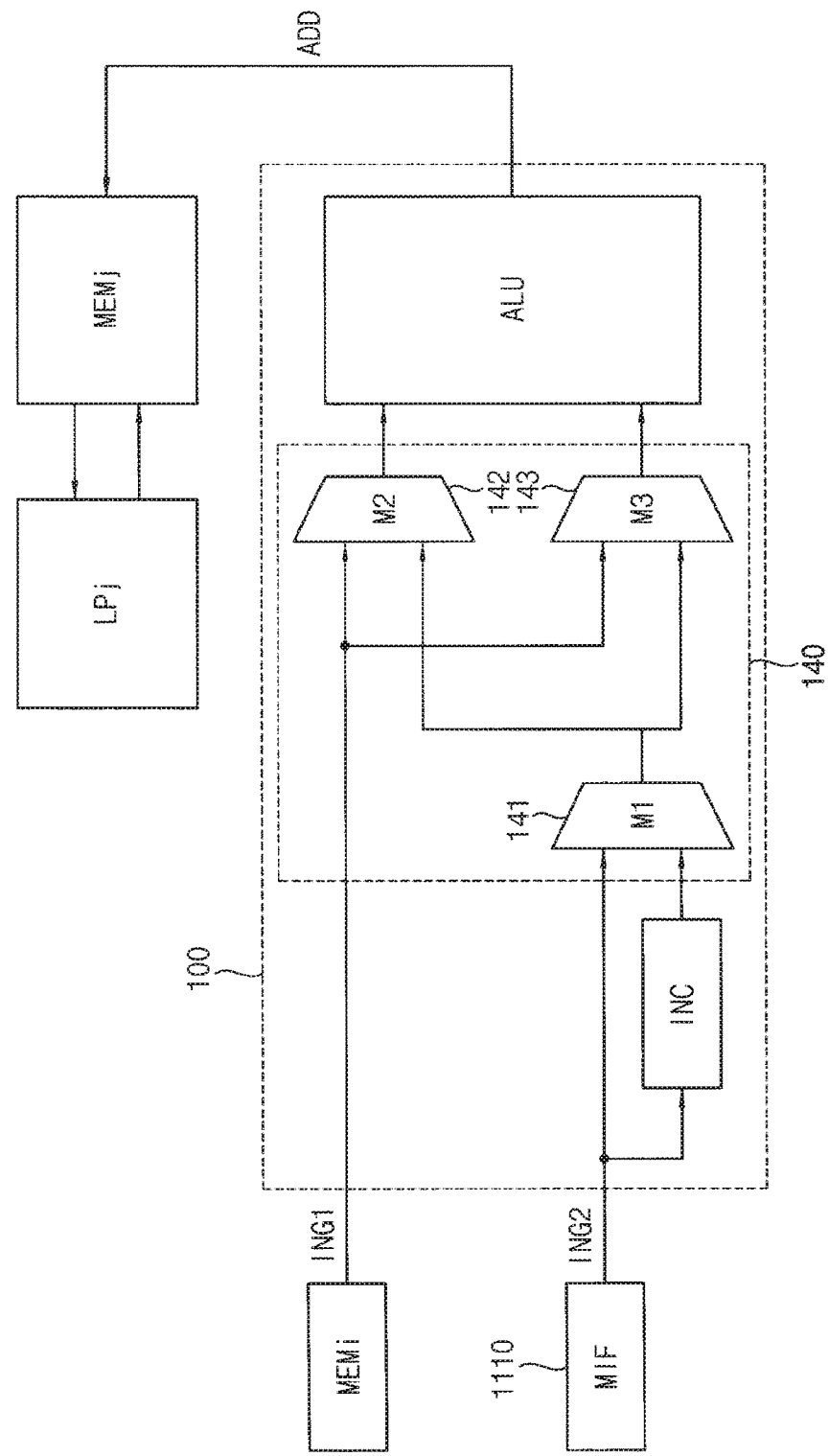
FIG. 6 is a block diagram illustrating a global processor of a logic semiconductor die in the stacked memory device of FIG. 1, according to an exemplary embodiment of the inventive concept.

FIG. 6 is a block diagram illustrating a global processor of a logic semiconductor die in the stacked memory device of FIG. 1, according to an exemplary embodiment of the inventive concept.

Referring to FIG. 6, a global processor 100 may include a selector 140 and an arithmetic logic unit ALU.

The selector 140 may include multiplexers (M1, M2, M4) 141, 142 and 143 configured to select and provide at least one of internal data ING1 provided from the memory integrated circuits (MEMi) and external data ING2 provided from an external device through the memory interface (MIF) 1110. The internal data ING1 and the external data ING2 may be an address or an offset or point value for generating a relative address. In an exemplary embodiment of the inventive concept, the global processor 100 may further include a counter INC configured to sequentially increase or decrease the external data ING2.

The arithmetic logic unit ALU may generate an address ADD to access the memory integrated circuit MEMj based on an output of the selector 140. The memory integrated circuit MEMj accessed by the address ADD may be identical to or different from the memory integrated circuit MEMi providing the internal data ING1.

The local processor LPj in the same memory semiconductor die of the memory integrated circuit MEMj may change the structure of the data stored in the memory integrated circuit MEMj based on the address ADD provided from the global processor 100. The change of the data structure may include various processes associated with data structures such as data gathering, data scattering, data transposition, data swapping, and the like.

As such, the global sub process performed by the global processor 100 may output the address ADD for accessing the memory integrated circuit MEMj, and then, the local processor LPj may change the structure of the data stored in the memory integrated circuit MEMj in response to the address ADD. The local processor LPj may access the memory integrated circuit MEMj in the same layer, in other words, the same memory semiconductor die. In this case, the local sub process may be performed without frequent exchange of data and/or control signals to reduce the bandwidth, and thus, power consumption may be reduced.

Figure 7:
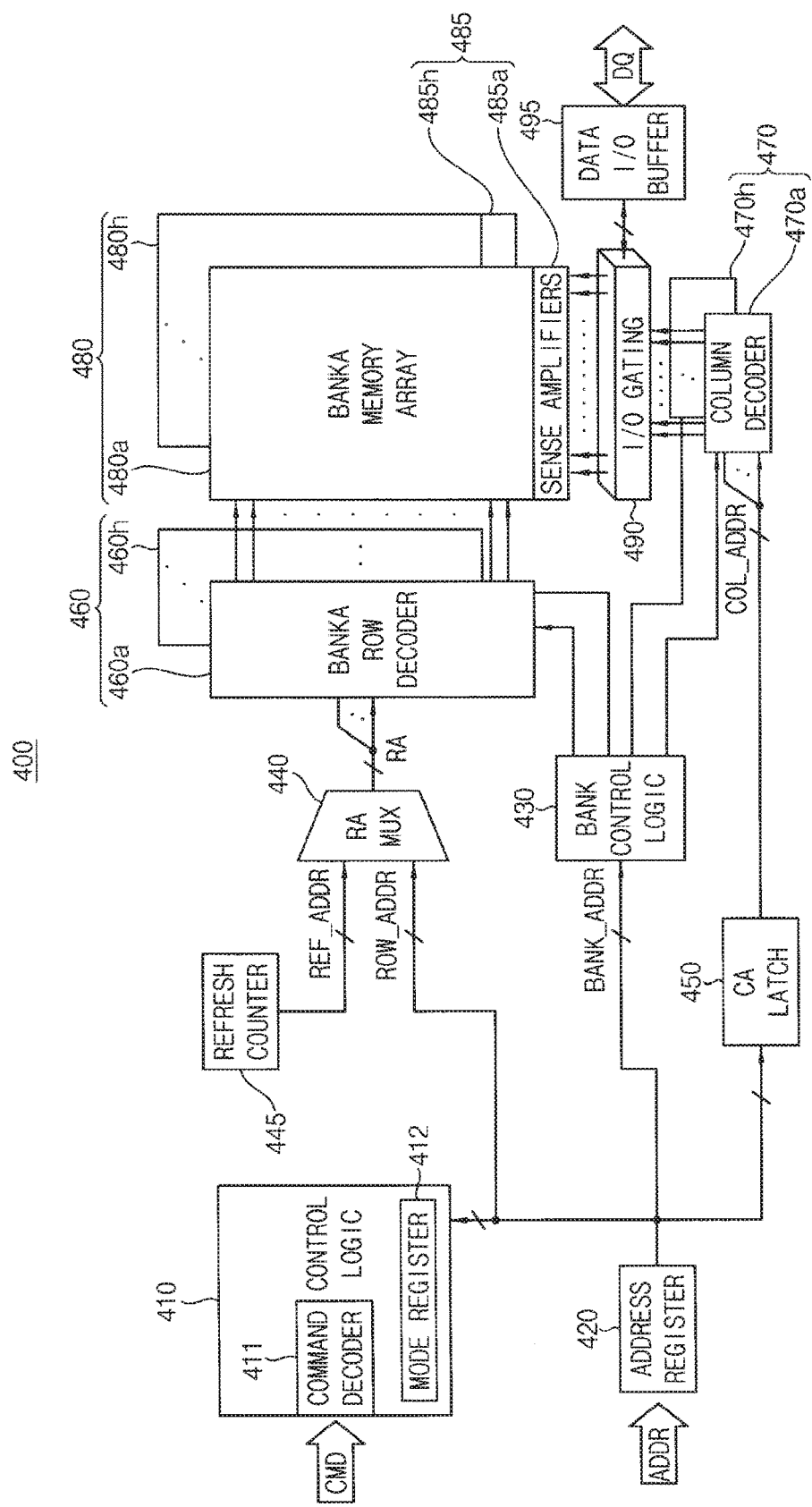
FIG. 7 is a block diagram illustrating a memory integrated circuit of a memory semiconductor die in the stacked memory device of FIG. 1, according to an exemplary embodiment of the inventive concept.

FIG. 7 is a block diagram illustrating a memory integrated circuit of a memory semiconductor die in the stacked memory device of FIG. 1, according to an exemplary embodiment of the inventive concept.

A DRAM is described as an example of the memory integrated circuits 1210 and 1310 formed in the memory semiconductor dies 1200 and 1300 with reference to FIG. 7. The stacked memory device 1000 may be any of a variety of memory cell architectures, including, but not limited to, volatile memory architectures such as DRAM, TRAM and SRAM, or non-volatile memory architectures, such as ROM, flash memory, FRAM, MRAM, and the like. Referring to FIG. 7, a memory integrated circuit 400 includes a control logic 410, an address register 420, a bank control logic 430, a row address multiplexer 440, a column address latch 450, a row decoder 460, a column decoder 470, a memory cell array 480, a sense amplifier unit 485, an input/output (I/O) gating circuit 490, a data input/output (I/O) buffer 495, and a refresh counter 445.

The memory cell array 480 may include a plurality of bank arrays 480a~480h. The row decoder 460 may include a plurality of bank row decoders 460a~460h respectively coupled to the bank arrays 480a~480h, the column decoder 470 may include a plurality of bank column decoders 470a~470h respectively coupled to the bank arrays 480a~480h, and the sense amplifier unit 485 may include a plurality of bank sense amplifiers 485a~485h respectively coupled to the bank arrays 480a~480h.

The address register 420 may receive an address ADDR including a bank address BANK_ADDR, a row address ROW_ADDR and a column address COL_ADDR from the memory controller. The address register 420 may provide the received bank address BANK_ADDR to the bank control logic 430, may provide the received row address ROW_ADDR to the row address multiplexer 440, and may provide the received column address COL_ADDR to the column address latch 450.

The bank control logic 430 may generate bank control signals in response to the bank address BANK_ADDR. One of the bank row decoders 460a~460h corresponding to the bank address BANK_ADDR may be activated in response to the bank control signals, and one of the bank column decoders 470a~470h corresponding to the bank address BANK_ADDR may be activated in response to the bank control signals.

The row address multiplexer 440 may receive the row address ROW_ADDR from the address register 420, and may receive a refresh row address REF_ADDR from the refresh counter 445. The row address multiplexer 440 may selectively output the row address ROW_ADDR or the refresh row address REF_ADDR as a row address RA. The row address RA that is output from the row address multiplexer 440 may be applied to the bank row decoders 460a~460h.

The activated one of the bank row decoders 460a~460h may decode the row address RA that is output from the row address multiplexer 440, and may activate a word-line corresponding to the row address RA. For example, the activated bank row decoder may apply a word-line driving voltage to the word-line corresponding to the row address RA.

The column address latch 450 may receive the column address COL_ADDR from the address register 420, and may temporarily store the received column address COL_ADDR. In an exemplary embodiment of the inventive concept, in a burst mode, the column address latch 450 may generate column addresses that increment from the received column address COL_ADDR. The column address latch 450 may apply the temporarily stored or generated column address to the bank column decoders 470a~470h.

The activated one of the bank column decoders 470a~470h may decode the column address COL_ADDR that is output from the column address latch 450, and may control the I/O gating circuit 490 to output data corresponding to the column address COL_ADDR.

The I/O gating circuit 490 may include a circuitry for gating input/output data. The I/O gating circuit 490 may further include read data latches for storing data that is output from the bank arrays 480a~480h, and write drivers for writing data to the bank arrays 480a~480h.

Data to be read from one bank array of the bank arrays 480a~480h may be sensed by one of the bank sense amplifiers 485a~48h coupled to the one bank array from which the data is to be read, and may be stored in the read data latches. The data stored in the read data latches may be provided to the memory controller via the data I/O buffer 495. Data DQ to be written in one bank array of the bank arrays 480a~480h may be provided to the data I/O buffer 495 from the memory controller. The write driver may write the data DQ in one bank array of the bank arrays 480a~480h.

The control logic 410 may control operations of the memory integrated circuit 400. For example, the control logic 410 may generate control signals for the memory integrated circuit 400 to perform a write operation or a read operation. The control logic 410 may include a command decoder 411 that decodes a command CMD received from the memory controller and a mode register set 412 that sets an operation mode of the memory integrated circuit 400. For example, the command decoder 411 may generate the control signals corresponding to the command CMD by decoding a write enable signal, a row address strobe signal, a column address strobe signal, a chip selection signal, etc.

Figure 8:
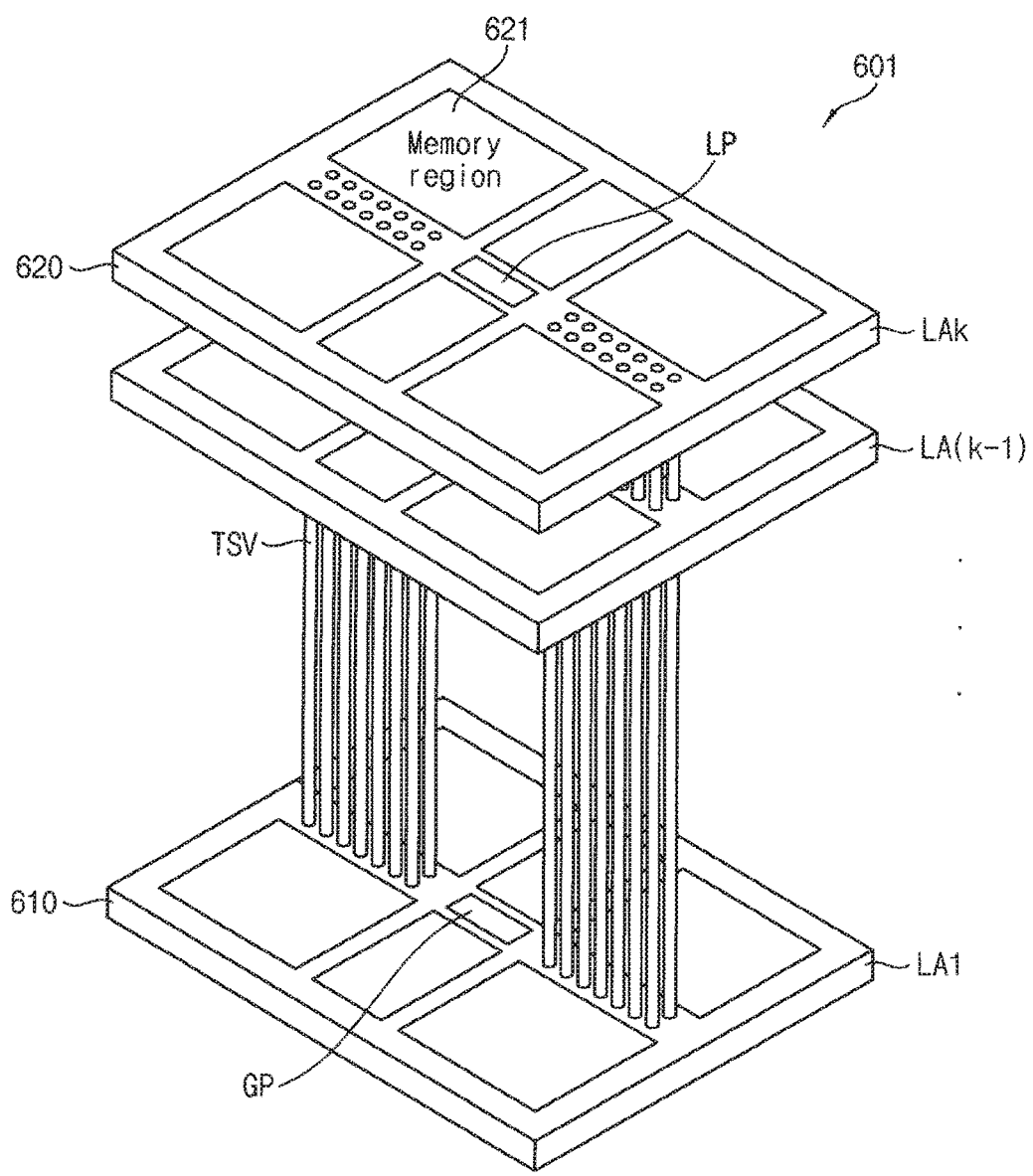
FIGS. 8 and 9 are diagrams illustrating structures of a stacked memory device according to exemplary embodiments of the inventive concept.
Figure 9:
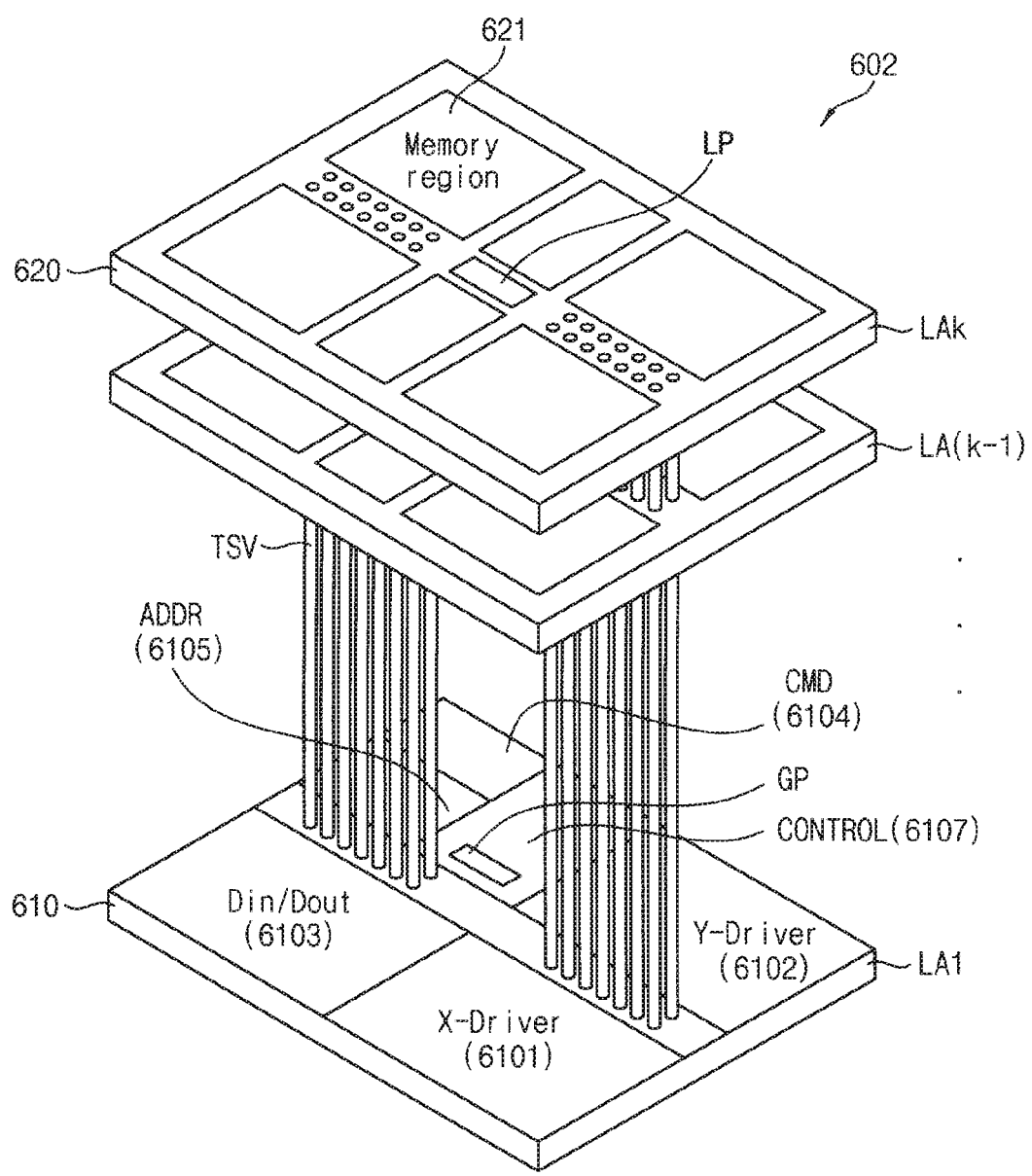

FIGS. 8 and 9 are diagrams illustrating structures of a stacked memory device according to exemplary embodiments of the inventive concept.

FIG. 8 illustrates an example configuration of a logic semiconductor die that includes a memory integrated circuit having a configuration equal to those of other memory integrated circuits of other memory semiconductor dies 620. FIG. 9 illustrates an example configuration of a logic semiconductor die that does not include a memory integrated circuit.

Referring to FIG. 8, a semiconductor memory device 601 may include first through kth semiconductor integrated circuit layers LA1 through LAk, in which the first semiconductor integrated circuit layer LA1 may be a master layer (e.g., a logic semiconductor die) and the other semiconductor integrated circuit layers LA2 through LAk may be slave layers (e.g., memory semiconductor dies).

The first through kth semiconductor integrated circuit layers LA1 through LAk may transmit and receive signals between the layers by through-substrate vias (e.g., through-silicon vias) TSVs. The first semiconductor integrated circuit layer LA1 as the master layer may communicate with an external device (e.g., a memory controller) through a conductive structure formed on an external surface. A description will be made regarding a structure and an operation of the semiconductor memory device 601 by mainly using the first semiconductor integrated circuit layer LA1 or 610 as the master layer and the kth semiconductor integrated circuit layer LAk or 620 as the slave layer.

The first semiconductor integrated circuit layer 610 and the kth semiconductor integrated circuit layer 620 may include memory regions 621 and various peripheral circuits for driving the memory regions 621. For example, the peripheral circuits may include a row (X)-driver for driving wordlines of the memory regions 621, a column (Y)-driver for driving bit lines of the memory regions 621, a data input/output unit (Din/Dout) for controlling input/output of data, a command buffer (CMD) for receiving a command CMD from the outside and buffering the command CMD, and an address buffer (ADDR) for receiving an address from the outside and buffering the address.

The first semiconductor integrated circuit layer 610 may further include a control logic to control overall operations of the semiconductor memory device 601 based on command and address signals from a memory controller.

According to an exemplary embodiment of the inventive concept, the master layer or the logic semiconductor die 610 may include a global processor GP and the other slave layers or the memory semiconductor dies 620 may include local processes LP, respectively. The data process may be performed dispersively using the global processor GP and the local processors LP and the process and the access of the data may be combined efficiently to reduce latency and power consumption.

Referring to FIG. 9, a semiconductor memory device 602 may include first through kth semiconductor integrated circuit layers LA1 through LAk, in which the first semiconductor integrated circuit layer LA1 may be an interface layer (e.g., a logic semiconductor die) and the other semiconductor integrated circuit layers LA2 through LAk may be memory layers (e.g., memory semiconductor dies).

The first through kth semiconductor integrated circuit layers LA1 through LAk may transmit and receive signals between the layers by through-substrate vias (e.g., through-silicon vias) TSVs. The first semiconductor integrated circuit layer LA1 as the interface layer may communicate with an external memory controller through a conductive structure formed on an external surface. A description will be made regarding a structure and an operation of the semiconductor memory device 602 by mainly using the first semiconductor integrated circuit layer LA1 or 610 as the interface layer and the kth semiconductor integrated circuit layer LAk or 620 as the memory layer.

The first semiconductor integrated circuit layer 610 as the master layer may include various peripheral circuits for driving the memory regions 621 in the kth semiconductor integrated circuit layer 620 as the memory layer. For example, the first semiconductor integrated circuit layer 610 may include a row (X)-driver 6101 for driving wordlines of memory regions 621, a column (Y)-driver 6102 for driving bit lines of the memory regions 621, a data input/output circuit (Din/Dout) 6103 for controlling input/output of data, a command buffer (CMD buffer) 6104 for receiving a command CMD from the outside and buffering the command CMD, and an address buffer (ADDR buffer) 6105 for receiving an address from the outside and buffering the address.

The first semiconductor integrated circuit layer 610 may further include a control circuit 6107 and the control circuit 6107 may generate control signals to control the memory regions 621 in the kth semiconductor integrated circuit layer 620 based on the command-address signals from the memory controller.

According to an exemplary embodiment of the inventive concept, the master layer or the logic semiconductor die 610 may include a global processor GP and the other slave layers or the memory semiconductor dies 620 may include local processes LP, respectively. The data process may be performed dispersively using the global processor GP and the local processors LP and the process and the access of the data may be combined efficiently to reduce latency and power consumption.

Figure 10:
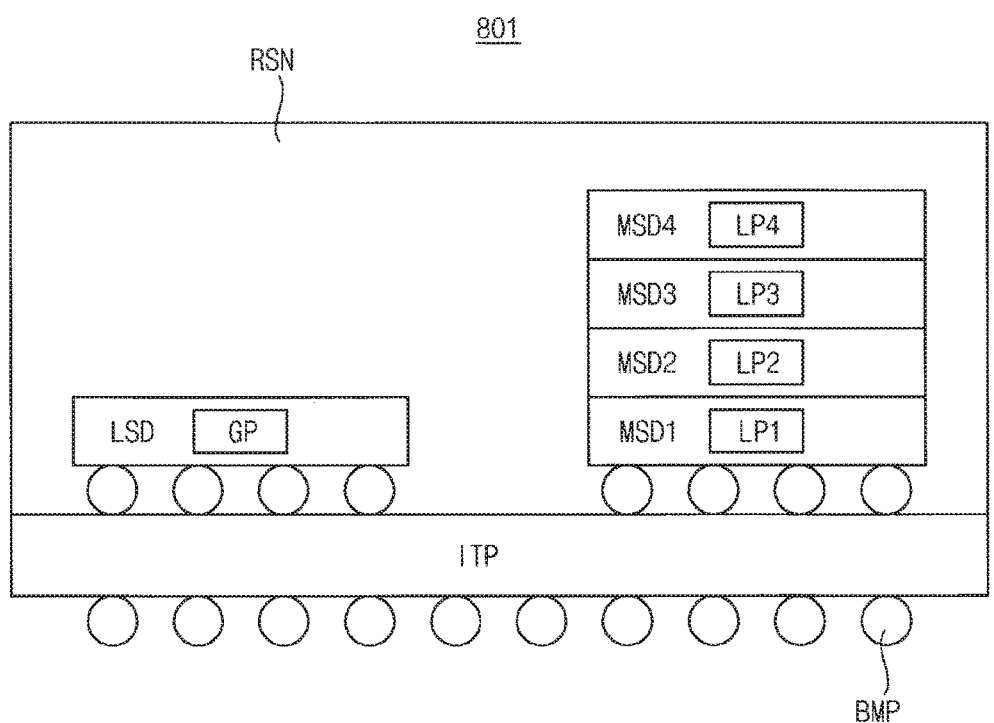
FIGS. 10 and 11 are diagrams illustrating packaging structures of a stacked memory device according to exemplary embodiments of the inventive concept.
Figure 11:
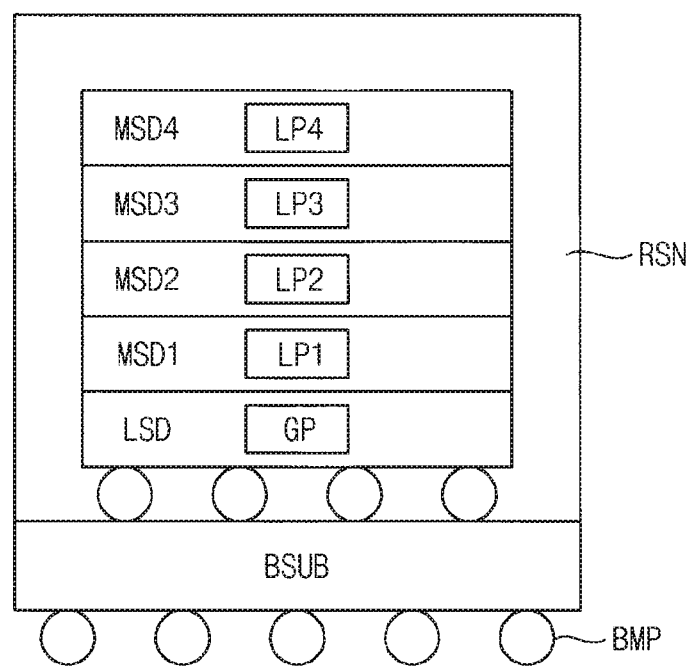

FIGS. 10 and 11 are diagrams illustrating packaging structures of a stacked memory device according to exemplary embodiments of the inventive concept.

Referring to FIG. 10, a memory chip 801 may include a base substrate or an interposer ITP and a stacked memory device stacked on the interposer ITP. The stacked memory device may include a logic semiconductor die LSD and a plurality of memory semiconductor dies MSD1~MSD4).

Referring to FIG. 11, a memory chip 802 may include a base substrate BSUB and a stacked memory device stacked on the base substrate BSUB. The stacked memory device may include a logic semiconductor die LSD and a plurality of memory semiconductor dies MSD1~MSD4).

FIG. 10 illustrates a structure in which the memory semiconductor dies MSD1~MSD4 except for the logic semiconductor die LSD are stacked vertically and the logic semiconductor die LSD is electrically connected to the memory semiconductor dies MSD1~MSD4 through the interposer ITP or the base substrate. In contrast, FIG. 11 illustrates a structure in which the logic semiconductor die LSD is stacked vertically with the memory semiconductor dies MSD1~MSD4.

As described above, a global processor GP is formed in the logic semiconductor die LSD and local processors LP1~LP4 are formed in the memory semiconductor dies MSD1~MSD4 to perform a data process dispersively according to exemplary embodiments of the inventive concept.

Hereinafter, the base substrate BSUB may be the same as the interposer ITP or include the interposer ITP. The base substrate BSUB may be a printed circuit board (PCB). External connecting elements such as conductive bumps BMP may be formed on a lower surface of the base substrate BSUB and internal connecting elements such as conductive bumps may be formed on an upper surface of the base substrate BSUB. In an exemplary embodiment of the inventive concept, the semiconductor dies LSD and MSD1~MSD4 may be electrically connected through through-silicon vias. In an exemplary embodiment of the inventive concept, the semiconductor dies LSD and MSD1~MSD4 may be electrically connected through bonding wires. In an exemplary embodiment of the inventive concept, the semiconductor dies LSD and MSD1~MSD4 may be electrically connected through a combination of the through-silicon vias and the bonding wires. In the exemplary embodiment of FIG. 10, the logic semiconductor die LSD may be electrically connected to the memory semiconductor dies MSD1~MSD4 through conductive line patterns formed in the interposer ITP. The stacked semiconductor dies LSD and MSD1~MSD4 may be packaged using resin RSN.

Figure 12:
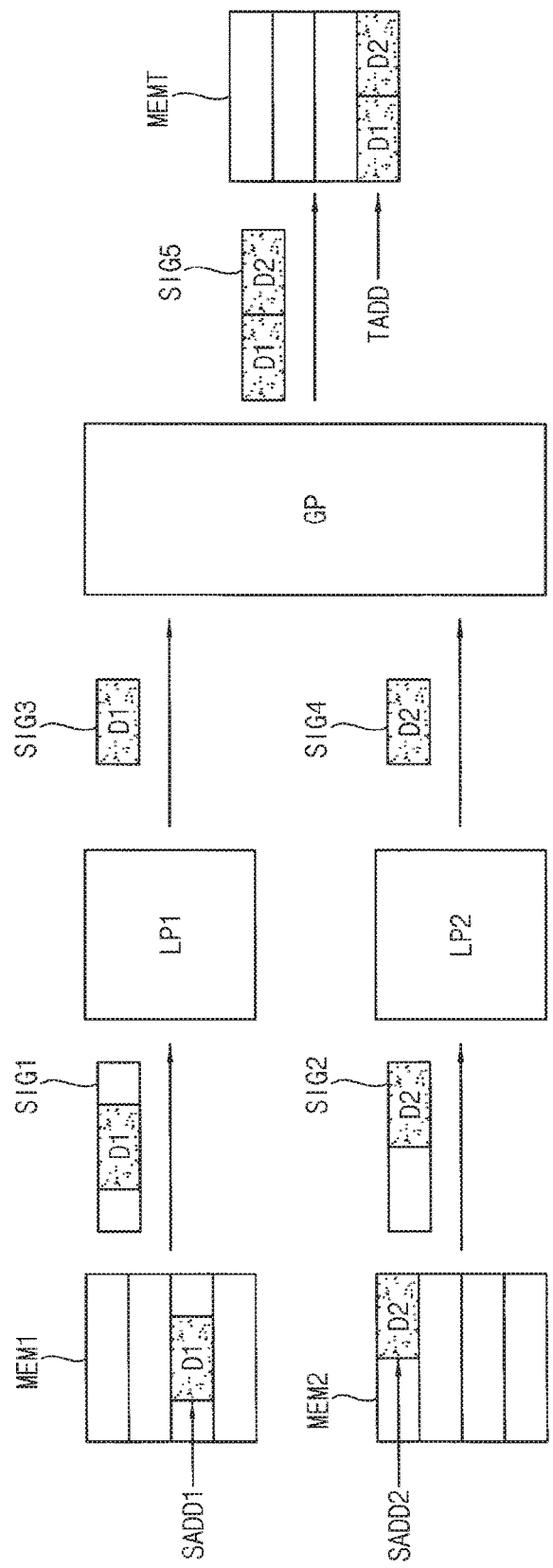
FIG. 12 is a diagram for describing data gathering of a data process performed by a stacked memory device according to an exemplary embodiment of the inventive concept.

FIG. 12 is a diagram for describing data gathering of a data process performed by a stacked memory device according to an exemplary embodiment of the inventive concept.

Referring to FIG. 12, data may be read out from inside of each memory semiconductor die and provided to each local processor. For example, the data including first data D1 may be read out from a first source address SADD1 of a first memory integrated circuit MEM1 and provided to a first local processor LP1 as a first signal SIG1 in a first memory semiconductor die. The data including second data D2 may be read out from a second source address SADD2 of a second memory integrated circuit MEM2 and provided to a second local processor LP2 as a second signal SIG2 in a second memory semiconductor die. The first local processor LP1 and the second local processor LP2 may perform the respective local sub processes to provide a third signal SIG3 and a fourth signal SIG4 as the results of the local sub processes. For example, the local sub processes performed by the first and second local processors LP1 and LP2 may be filtering operations for extracting the first data D1 and the second data D2 from the input data. The first and second local processors LP1 and LP2 may have the same configuration and the local sub processes by the first and second local processors LP1 and LP2 may be performed in parallel and simultaneously.

The result of the local sub processes, in other words, the third and fourth signals SIG3 and SIG4 may be provided to the global processor GP and the global processor GP may perform the global sub process in response to the third and fourth signals SIG3 and SIG4. For example, the global sub process performed by the global processor GP may be a process of combing the input data D1 and D2 to generate a fifth signal SIG5 and store the combined data in a target address TADD of the memory integrated circuit MEMT.

Figure 13:
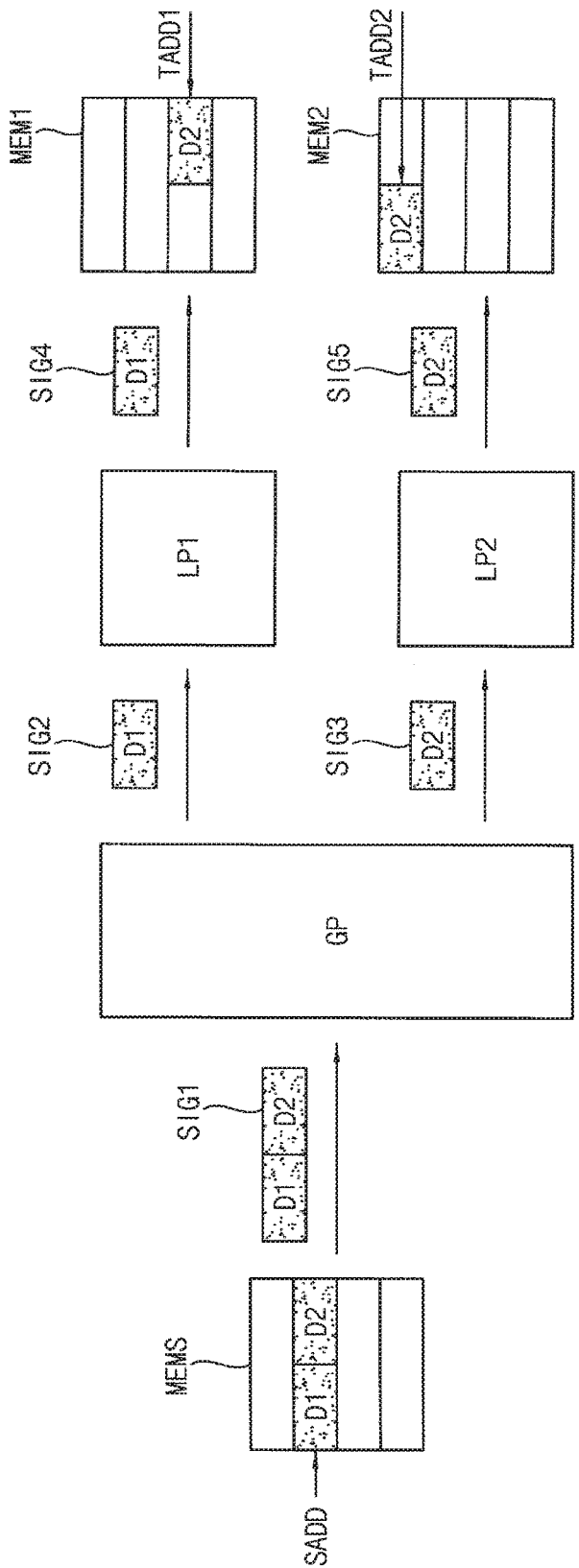
FIG. 13 is a diagram for describing data scattering a data process performed by a stacked memory device according to an exemplary embodiment of the inventive concept.

FIG. 13 is a diagram for describing data scattering a data process performed by a stacked memory device according to an exemplary embodiment of the inventive concept.

Referring to FIG. 13, data including first data D1 and second data D2 may be read out from a source address SADD of a memory integrated circuit MEMS and provided to a global processor GP as a first signal SIG1. The global processor GP may perform global sub processes to produce a second signal SIG2 and a third signal SIG3 as the result of the global sub process. For example, the global sub processes performed by the global processor GP may be a process of separating the first data D1 and the second data D2 from the input data.

The result of the global sub process, in other words, the second and third signals SIG2 and SIG3 may be provided to first and second local processors LP1 and LP2 and the first and second local processors may perform respective local sub processes. For example, the local sub processes performed by the first and second local processors LP1 and LP2 may be a process of storing the input data in respective storage regions. Before storing the input data, the input data may be filtered by the first and second local processors LP1 and LP2, and then, the filtered data may be stored. The first local processor LP1 may generate a fourth signal SIG4 to store the first data D1 in a first target address TADD1 of a first memory integrated circuit MEM1 and the second local processor LP2 may generate a fifth signal SIG5 to store the second data D2 in a second target address TADD2 of a second memory integrated circuit MEM2. The first and second local processors LP1 and LP2 may have the same configuration and the local sub processes by the first and second local processors LP1 and LP2 may be performed in parallel and simultaneously.

Figure 14:
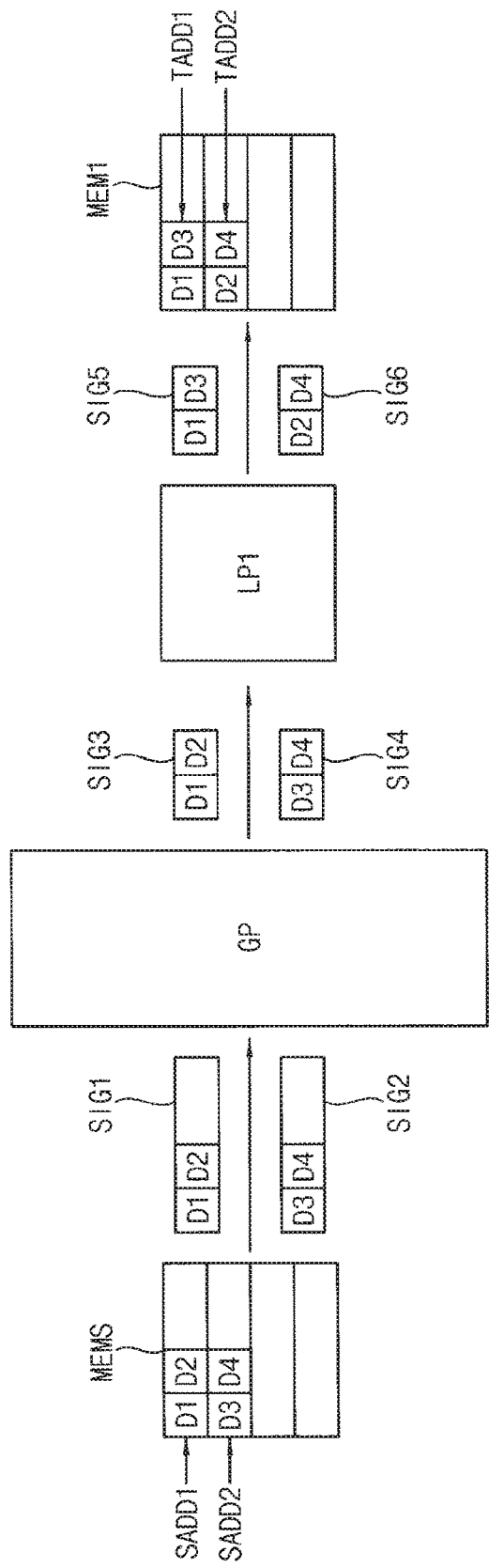
FIG. 14 is a diagram for describing data transposition of a data process performed by a stacked memory device according to an exemplary embodiment of the inventive concept.

FIG. 14 is a diagram for describing data transposition of a data process performed by a stacked memory device according to an exemplary embodiment of the inventive concept.

Referring to FIG. 14, data including first through fourth data D1 through D4 may be read out from first and second source addresses SADD1 and SADD2 of a memory integrated circuit MEMS and provided to a global processor GP as a first signal SIG1 and a second signal SIG2. The global processor GP may perform a global sub process to produce a third signal SIG3 and a fourth signal SIG4 as the results of the global sub process. For example, the global sub process performed by the global processor GP may be filtering operations for extracting the first through fourth data D1 through D4 from the input data.

The result of the global sub process, in other words, the third and fourth signals SIG3 and SIG4 may be provided to the first local processor LP1 and the first local processor LP1 may perform the local sub process in response to the third and fourth signals SIG3 and SIG4. For example, the local sub process performed by the first local processor LP1 may be a process of performing data transposition to the transposed data. As illustrated in FIG. 14, the second data D2 and the third data D3 may be transposed. The first local processor LP1 may generate a fifth signal SIG5 to store the first and third data D1 and D3 in a first target address TADD1 of the first memory integrated circuit MEM1 and generate a sixth signal SIG6 to store the second and fourth data D2 and D4 in a second target address TADD2 of the first memory integrated circuit MEM1.

The data process associated with data structure may be performed dispersively as described with reference to FIGS. 12, 13 and 14, which are non-limiting exemplary embodiments of the inventive concept. It is to be understood that the present inventive concept may be applied to various data processes.

Figure 15:
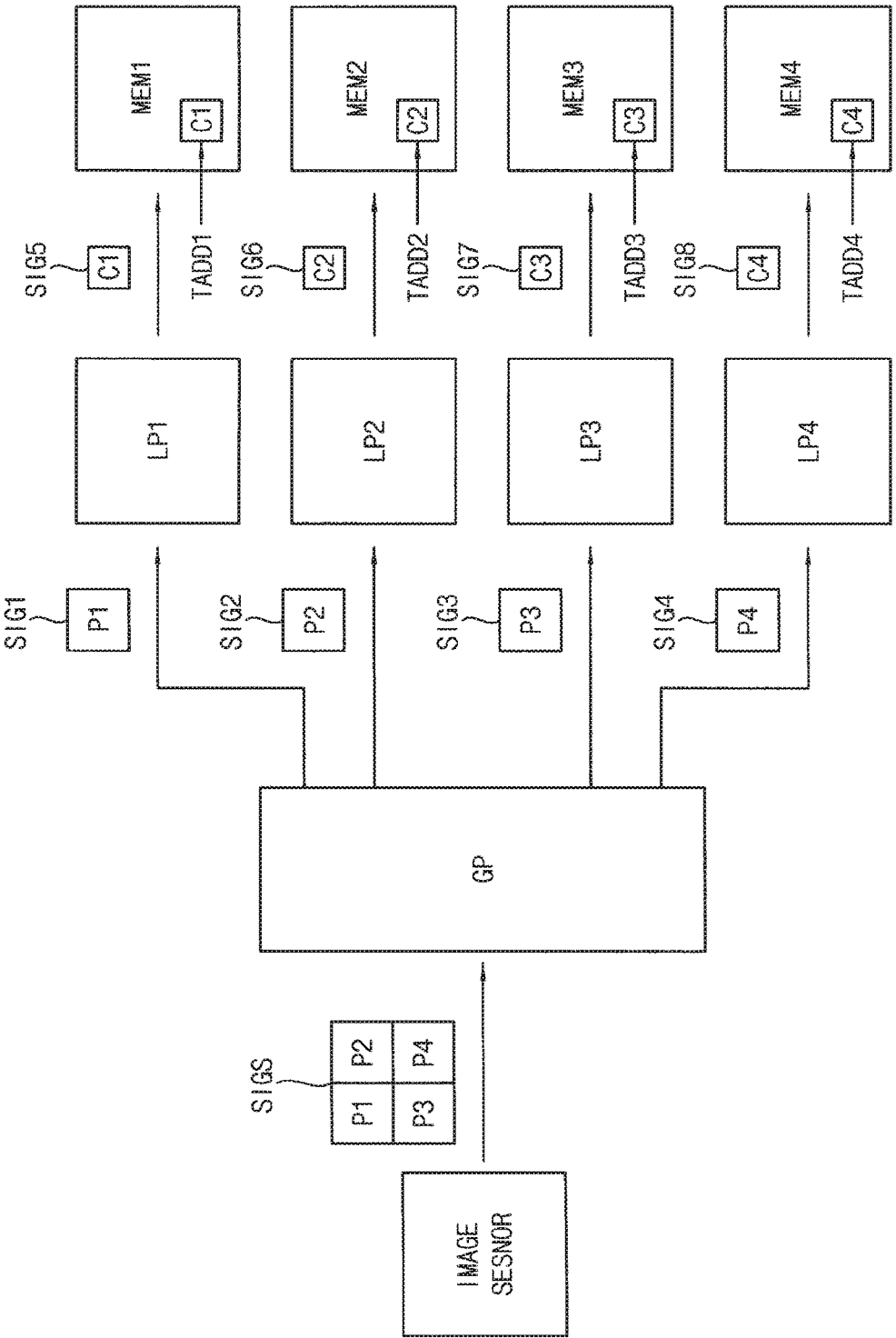
FIG. 15 is a diagram for describing image signal processing of a data process performed by a stacked memory device according to an exemplary embodiment of the inventive concept.

FIG. 15 is a diagram for describing image signal processing of a data process performed by a stacked memory device according to an exemplary embodiment of the inventive concept.

Referring to FIG. 15, data P1, P2, P3 and P4 corresponding to a frame, which are sensed by an image sensor, may be provided as a source signal SIGS to a global processor GP. The global processor GP may perform a global sub process to provide signals SIG1~SIG4 as the result of the global sub process. FIG. 15 illustrates a non-limiting example in that one frame of data is divided into four portion data P1~P4. However, the global processor GP may divide the one frame of data into various numbers of portion data. In an exemplary embodiment of the inventive concept, the global processor GP may provide the portion data P1~P4 as macroblocks and/or slices according to the H.264 standards.

The result of the global sub process, in other words, the first through fourth signals SIG1~SIG4 may be provided to first through fourth local processors LP1~LP4, respectively, and the first through fourth local processors LP1~LP4 may perform local sub processes. For example, the local sub processes performed by the first through fourth local processors LP1~LP4 may be processes of compressing or coding the input portion data P1~P4 to produce and subsequently store compressed portion data C1~C4 in respective storage regions. The compressed portion data C1~C4 may have a size smaller than the input portion data P1~P4. The first local processor LP1 may generate a fifth signal SIG5 to store the first compressed data C1 in a first target address TADD1 of the first memory integrated circuit MEM1, the second local processor LP2 may generate a sixth signal SIG6 to store the second compressed data C2 in a second target address TADD2 of the second memory integrated circuit MEM2, the third local processor LP3 may generate a seventh signal SIG7 to store the third compressed data C3 in a third target address TADD3 of the third memory integrated circuit MEM3, and the fourth local processor LP4 may generate an eighth signal SIG8 to store the fourth compressed data C4 in a fourth target address TADD4 of the fourth memory integrated circuit MEM4.

Figure 16:
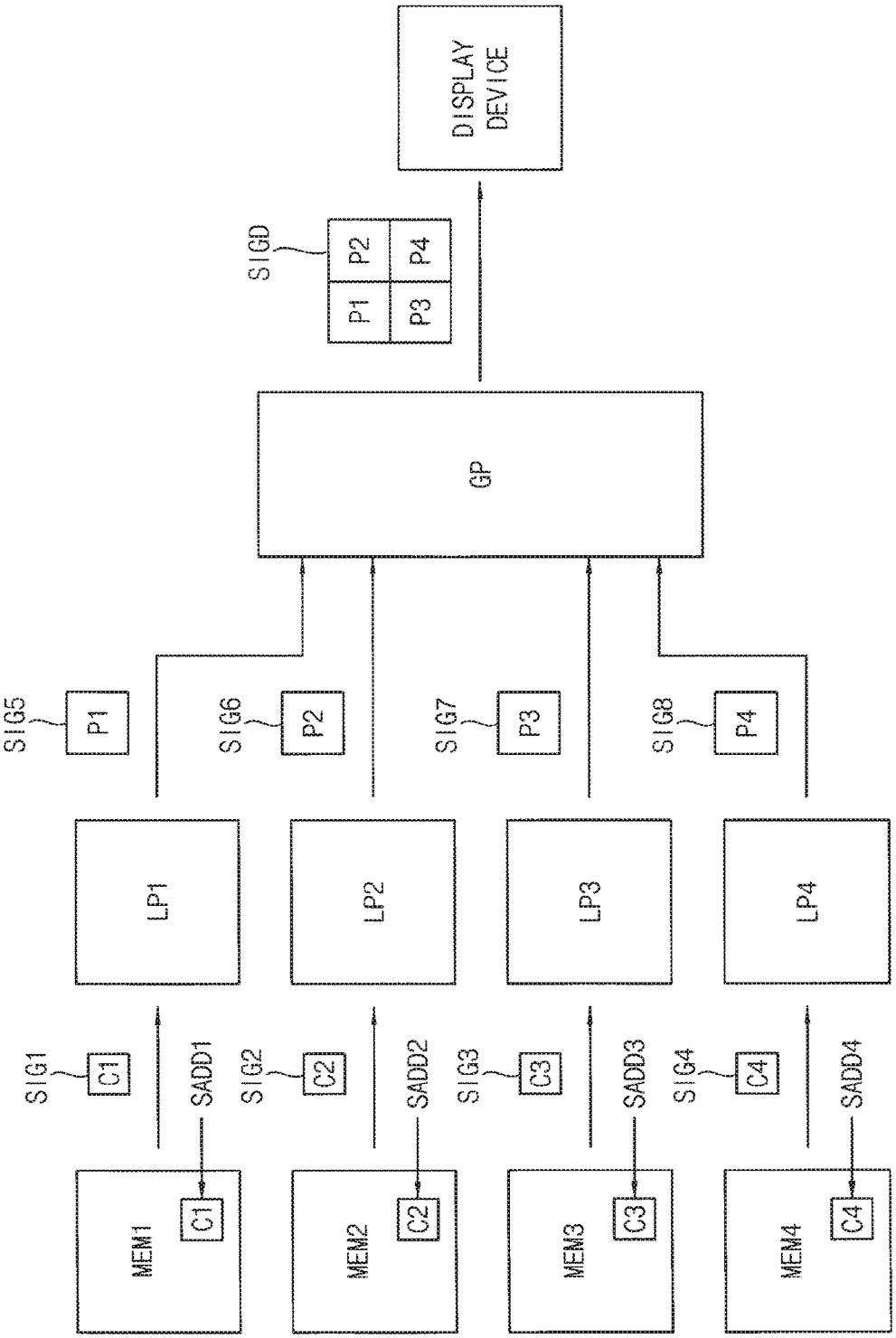
FIG. 16 is a diagram for describing display data processing of a data process performed by a stacked memory device according to an exemplary embodiment of the inventive concept.

FIG. 16 is a diagram for describing display data processing of a data process performed by a stacked memory device according to an exemplary embodiment of the inventive concept.

Referring to FIG. 16, data may be read out from inside of each memory semiconductor die and provided to each local processor. For example, first data C1 may be read out from a first source address SADD1 of a first memory integrated circuit MEM1 and provided to a first local processor LP1 as a first signal SIG1 in a first memory semiconductor die, second data C2 may be read out from a second source address SADD2 of a second memory integrated circuit MEM2 and provided to a second local processor LP2 as a second signal SIG2 in a second memory semiconductor die, third data C3 may be read out from a third source address SADD3 of a third memory integrated circuit MEM3 and provided to a third local processor LP3 as a third signal SIG in a third memory semiconductor die, and fourth data C4 may be read out from a fourth source address SADD4 of a fourth memory integrated circuit MEM4 and provided to a fourth local processor LP4 as a fourth signal SIG4 in a fourth memory semiconductor die. The first through fourth local processors LP1 through LP4 may perform local sub processes to provide fifth through eighth signals SIG5 through SIG8 as results of the local sub processes. For example, the first through fourth data C1 through C4 may be the compressed portion data corresponding to one frame of data as described above and the local sub processes may be data decoding processes of decompressing or decoding the compressed portion data C1~C4 to provide decoded portion data P1~P4.

The result of the local sub processes, in other words, the fifth through eighth signals SIG5 through SIG8 may be provided to the global processor GP and the global processor GP may perform a global sub process in response to the fifth through eighth signals SIG5 through SIG8. For example, the global sub process performed by the global processor GP may be a process of combing the input portion data P1 through P4 and generating a display signal SIGD suitable for a display format. The display signal may then be provided to a display device.

In the examples of FIGS. 15 and 16, the first through fourth local processors LP1 through LP4 may have the same configuration and the local sub processes of the first through fourth local processors LP1 through LP4 may be performed in parallel and simultaneously. In addition, the first through fourth local processors LP1 through LP4 may access the respective memory integrated circuits MEM1 through MEM4 in the corresponding memory semiconductor dies. Accordingly the local sub processes may be performed without frequent exchange of data and/or control signals between the semiconductor dies to reduce bandwidth, and thus, power consumption may be reduced.

Figure 17:
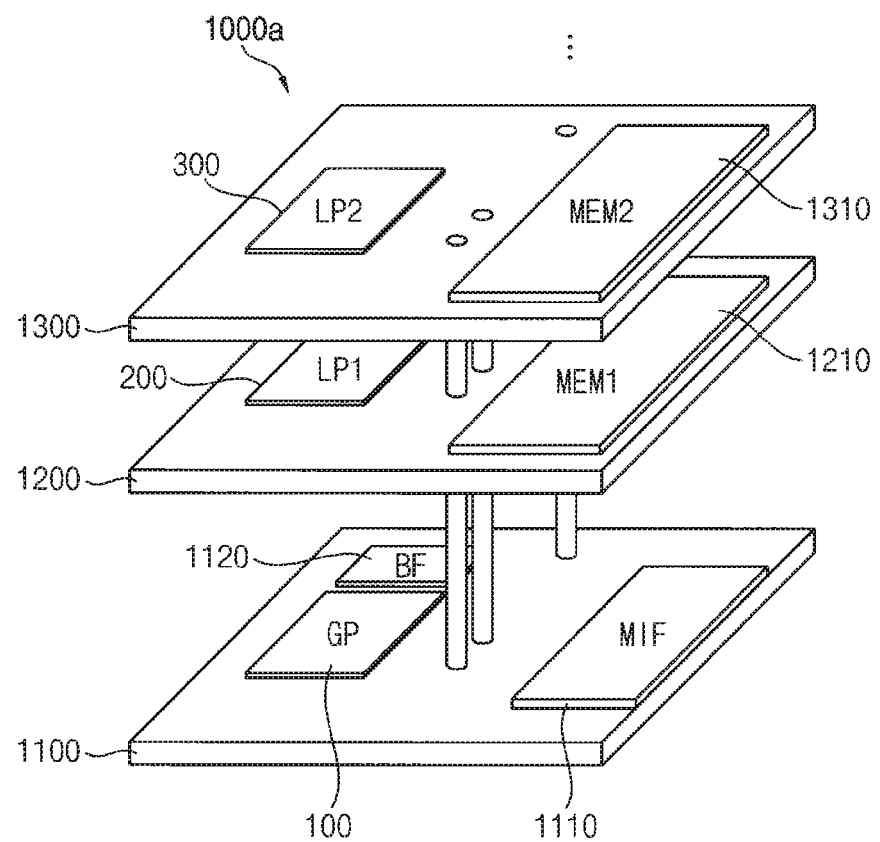
FIG. 17 is an exploded, perspective view of a system including a stacked memory device according to an exemplary embodiment of the inventive concept.

FIG. 17 is an exploded, perspective view of a system including a stacked memory device according to an exemplary embodiment of the inventive concept.

A stacked memory device 1000a of FIG. 17 is similar to the stacked memory device 1000 of FIG. 1, and thus, repeated descriptions are omitted.

In comparison with the stacked memory device 1000 of FIG. 1, the stacked memory device 1000a of FIG. 17 may further include a buffer memory (BF) 1120 configured to temporarily store data associated with a data process. Using the buffer memory 1120, the operand data of the global processor GP and the local processors LP1 and LP2 and the result data may be stored temporarily. The buffer memory 1120 may be implemented such that the access time of the global processor GP to the buffer memory 1120 may be shorter than the access time of the global processor GP to the memory integrated circuits MEM1 and MEM2. In addition, the buffer memory 1120 may be implemented such that the buffer memory 1120 may be accessed directly by an external device such as a host device. Using the buffer memory 1120, the stacked memory device 1000a and a system including the stacked memory device 1000a may have an increased operation speed and reduced power consumption.

Figure 18:
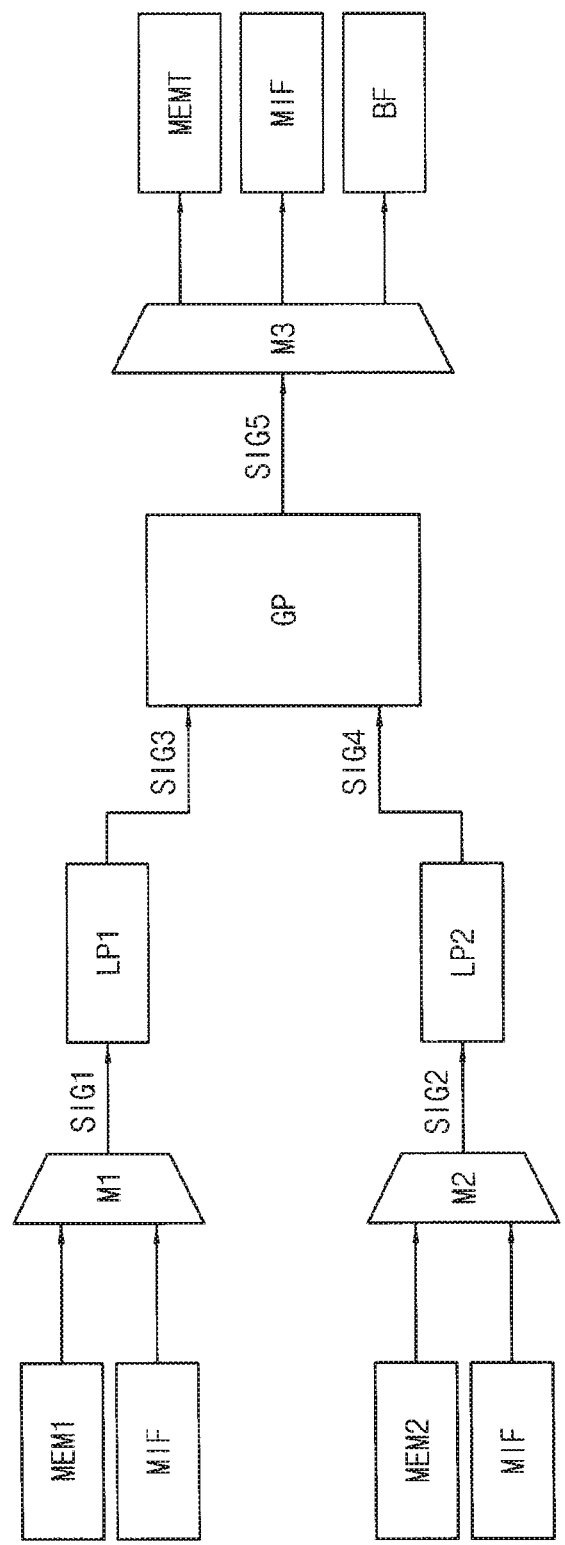
FIGS. 18, 19 and 20 are diagrams for describing data flow in a stacked memory device according to exemplary embodiments of the inventive concept.
Figure 19:
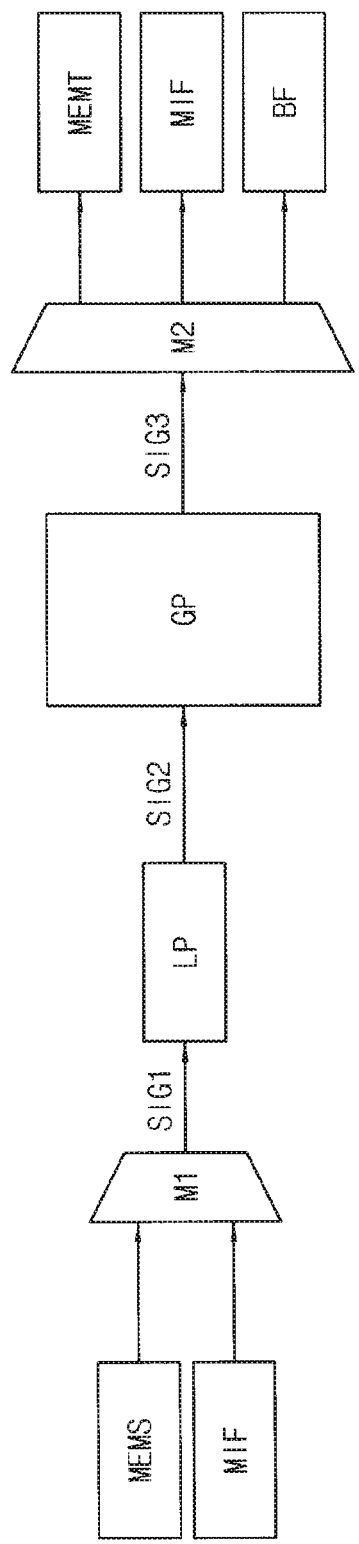
Figure 20:
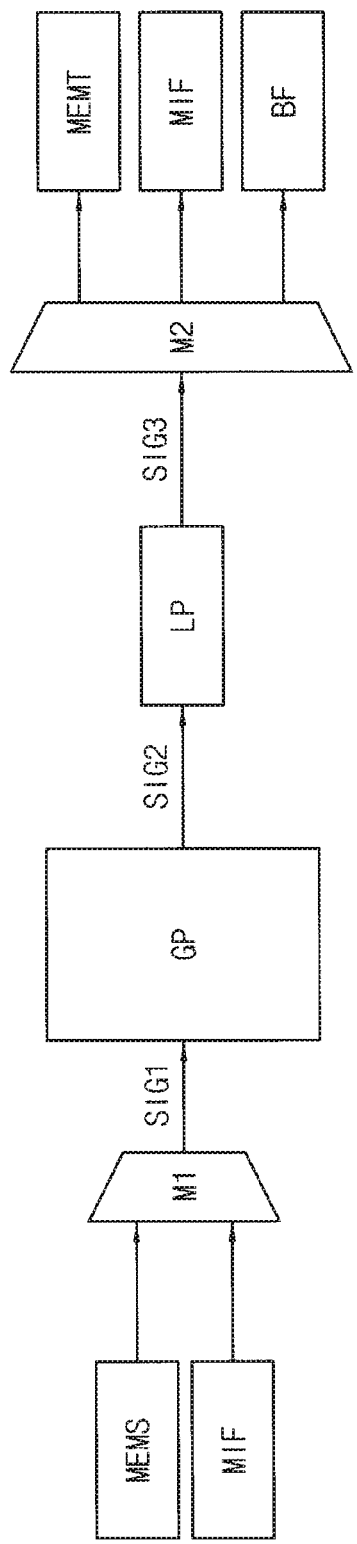

FIGS. 18, 19 and 20 are diagrams for describing data flow in a stacked memory device according to exemplary embodiments of the inventive concept.

Referring to FIG. 18, a first local processor LP1 and a second local processor LP2 may perform respective local sub processes in parallel or simultaneously and a global processor GP may perform a global sub process in response to results of the local sub processes.

A first selector M1 may select one of internal data provided from a first memory integrated circuit MEM1 and external data from an external device through a memory interface MIF to provide a first signal SIG1 to the first local processor LP1. A second selector M2 may select one of internal data provided from a second memory integrated circuit MEM2 and external data from an external device through the memory interface MIF to provide a second signal SIG2 to the second local processor LP2. The first and second local processors LP1 and LP2 may perform respective local sub processes in parallel or simultaneously to provide third and fourth signals SIG3 and SIG4, respectively, and the global processor GP may perform the global sub process in response to the third and fourth signals SIG3 and SIG4 corresponding to the results of the local sub processes to provide a fifth signal SIG5. A third selector M3 may output the fifth signal SIG5 corresponding to the result of the global sub process or the result of the data process to one of a buffer memory BF, a target memory integrated circuit MEMT and the external device through the memory interface MIF.

Referring to FIG. 19, a local processor LP may perform a local sub process in advance, and then, a global processor GP may perform a global sub process in response to a result of the local sub process.

A first selector M1 may select one of internal data provided from a source memory integrated circuit MEMS and external data from an external device through a memory interface MIF to provide a first signal SIG1 to the local processor LP. The local processor LP may perform the local sub process to provide a second signal SIG2, and the global processor GP may perform the global sub process in response to the second signal SIG2 corresponding to the result of the local sub process to provide a third signal SIG3. A second selector M2 may output the third signal SIG3 corresponding to the result of the global sub process or the result of the data process to one of a buffer memory BF, a target memory integrated circuit MEMT and the external device through the memory interface MIF.

Referring to FIG. 20, a global processor GP may perform a global sub process in advance, and then, a local processor LP may perform a local sub process in response to a result of the global sub process.

A first selector M1 may select one of internal data provided from a source memory integrated circuit MEMS and external data from an external device through a memory interface MIF to provide a first signal SIG1 to the global processor GP. The global processor GP may perform the global sub process to provide a second signal SIG2, and the local processor LP may perform the local sub process in response to the second signal SIG2 corresponding to the result of the global sub process to provide a third signal SIG3. A second selector M2 may output the third signal SIG3 corresponding to the result of the local sub process or the result of the data process to one of a buffer memory BF, a target memory integrated circuit MEMT and the external device through the memory interface MIF.

Figure 21:
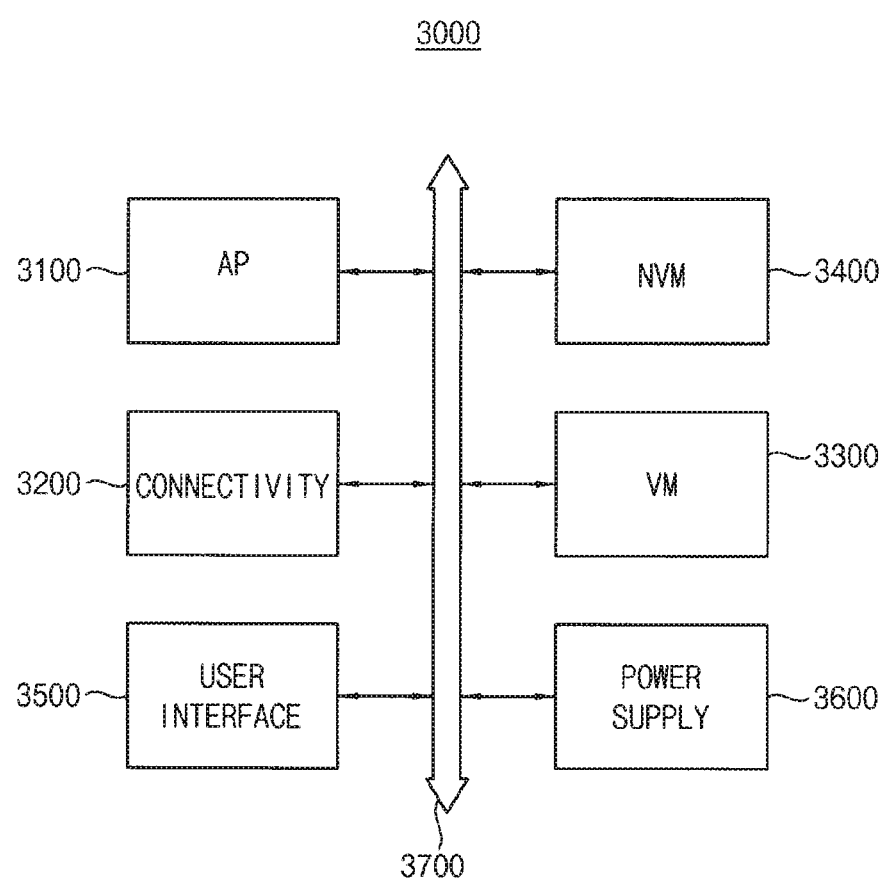
FIG. 21 is a block diagram illustrating a mobile system according to an exemplary embodiment of the inventive concept.

FIG. 21 is a block diagram illustrating a mobile system according to an exemplary embodiment of the inventive concept.

Referring to FIG. 21, a mobile system 3000 includes an application processor 3100, a connectivity unit 3200, a volatile memory device (VM) 3300, a nonvolatile memory device (NVM) 3400, a user interface 3500, and a power supply 3600 connected via a bus 3700.

The application processor 3100 may execute applications such as a web browser, a game application, a video player, etc. The connectivity unit 3200 may perform wired or wireless communication with an external device. The volatile memory device 3300 may store data processed by the application processor 3100, or may operate as a working memory. For example, the volatile memory device 3300 may be a DRAM, such as a double data rate synchronous dynamic random access memory (DDR SDRAM), low power DDR (LPDDR) SDRAM, graphics DDR (GDDR) SDRAM, Rambus DRAM (RDRAM), etc. The nonvolatile memory device 3400 may store a boot image for booting the mobile system 3000 and other data. The user interface 3500 may include at least one input device, such as a keypad, a touch screen, etc., and at least one output device, such as a speaker, a display device, etc. The power supply 3600 may supply a power supply voltage to the mobile system 3000. In an exemplary embodiment of the inventive concept, the mobile system 3000 may further include a camera image processor (CIS), and/or a storage device, such as a memory card, a solid state drive (SSD), a hard disk drive (HDD), a compact disc read only memory (CD-ROM), etc.

The volatile memory device 3300 and/or the nonvolatile memory device 3400 may be implemented in a stacked structure as described with reference to FIGS. 1 through 20. The stacked structure may include a logic semiconductor die including a global processor GP and at least one memory semiconductor die including a local processor LP.

The global processor GP and the local processor LP may be implemented as software, hardware or combination of software and hardware. Particularly, the processing units of the global processor GP and the local processor LP may be implemented products including program codes which are stored in a computer readable medium.

As described above, the stacked memory device, associated systems and methods according to exemplary embodiments of the inventive concept may efficiently combine process and access (e.g., read and write) of data to reduce latency and power consumption by distributing memory-intensive and data-intensive processes to the global processor in the logic semiconductor die and the local processors in the memory semiconductor dies. In addition, the stacked memory device, associated systems and methods according to exemplary embodiments of the inventive concept may reduce bandwidth of data transferred between the stacked memory device and an external device of a host device by performing a data process, which is to be performed by the external device, in the global processor and the local processor. Furthermore the stacked memory device, associated systems and methods according to exemplary embodiments may offload the data process that is to be performed by the external device so that the external device may perform other tasks rapidly, thereby enhancing overall system performance.

Exemplary embodiments of the present inventive concept may be applied to any devices and systems including a memory device. For example, exemplary embodiments of the present inventive concept may be applied to systems such as be a mobile phone, a smart phone, a personal digital assistant (PDA), a portable multimedia player (PMP), a digital camera, a camcorder, personal computer (PC), a server computer, a workstation, a laptop computer, a digital television (TV), a set-top box, a portable game console, a navigation system, etc.

While the inventive concept has been particularly shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A stacked memory device, comprising:
a logic semiconductor die;
a plurality of memory semiconductor dies stacked with the logic semiconductor die;
a plurality of through-silicon vias (TSVs) electrically connecting the logic semiconductor die and the memory semiconductor dies;
a global processor disposed in the logic semiconductor die and configured to perform a global sub process corresponding to a portion of a data process;
a plurality of local processors respectively disposed in the memory semiconductor dies and configured to perform local sub processes corresponding to other portions of the data process; and
a plurality of memory integrated circuits respectively disposed in the memory semiconductor dies and configured to store data associated with the data process, wherein each of the memory integrated circuits includes a sense amplifier coupled to one bank array of a memory cell array,
wherein at least one of the local processors includes:
a comparator configured to compare reference data and read data provided from its corresponding memory integrated circuit in response to a read address;
a shift register configured to sequentially shift bits of the read data when a bit number of the read data is larger than a bit number of the reference data, wherein the shift register is further configured to detect whether the read data includes the same data/pattern as the reference data; and an address generator configured to generate the read address that is sequentially increasing or decreasing, the address generator further configured to determine a range of the data/pattern based on a start address and an end address provided from the global processor.

2. The stacked memory device of claim 1, wherein the global processor and the local processors perform the data process instead of an external device.

3. The stacked memory device of claim 2, wherein the global processor performs the global sub process in response to external data provided from the external device or internal data provided from the memory integrated circuits and the local processors perform the local sub processes in response to a result of the global sub process.

4. The stacked memory device of claim 3, wherein the global processor performs the global sub process in response to the external data provided from the external device and each of the local processors stores a result of its local sub process in its corresponding memory integrated circuit.

5. The stacked memory device of claim 3, wherein the result of the global sub process is an address to access the memory integrated circuits and each of the local processors accesses its corresponding memory integrated circuit in response to the address to obtain data for its local sub process.

6. The stacked memory device of claim 2, wherein the local processors perform the local sub processes in response to external data provided from an external device or internal data provided from the memory integrated circuits and the global processor performs the global sub process in response to a result of the local sub processes.

7. The stacked memory device of claim 6, wherein each of the local processors performs its local sub process in response to the internal data provided from its corresponding memory integrated circuit and the global processor provides a result of the global sub process to the external device.

8. The stacked memory device of claim 2, wherein the global processor includes:
a selector configured to select and output external data provided from an external device or internal data provided from the memory integrated circuits; and
an arithmetic logic unit configured to generate an address to access the memory integrated circuits in response to an output of the selector.

9. The stacked memory device of claim 8, wherein the local processors change a structure of data stored in the memory integrated circuits in response the address provided from the global processor.

10. The stacked memory device of claim 1, wherein the global sub process performed by the global processor is varied depending on a type of the data process.

11. The stacked memory device of claim 10, wherein the global processor includes:
a plurality of processing units configured to perform different processes;
an input selector configured to select one of input signals as an input of the processing units in response to a first selection signal;
an output selector configured to select one of outputs of the processing units as an output signal in response to a second selection signal; and
a selection controller configured to generate the first selection signal and the second selection signal according to the type of the data process.

12. The stacked memory device of claim 1, wherein the local sub processes performed by the local processors are fixed.

13. The stacked memory device of claim 1, wherein at least two processes of the local processes performed by the local processors are equal to each other.

14. The stacked memory device of claim 1, wherein at least two processes of the local processes performed by the local processors are performed simultaneously.

15. The stacked memory device of claim 1, wherein at least two processes of the local processes performed by the local processors are different from each other.

16. The stacked memory device of claim 1, wherein the logic semiconductor die further includes a memory integrated circuit having a configuration that is the same as that of memory integrated circuits of the memory semiconductor dies.

17. The stacked memory device of claim 1, wherein the logic semiconductor die further includes a buffer memory configured to store data associated with the data process and a result of the data process is output to the buffer memory, the memory integrated circuits or an external device.

18. A stacked memory device, comprising:
a logic semiconductor die including a global processor configured to perform a global sub process corresponding to a portion of a data process; and
a plurality of memory semiconductor dies stacked vertically, the memory semiconductor dies including a plurality of local processors configured to perform local sub processes corresponding to other portions of the data process and a plurality of memory integrated circuits configured to store data associated with the data process,
wherein the global processor includes:
a plurality of processing units configured to perform different processes;
an input selector configured to select one of input signals as an input of the processing units in response to a selection signal; and
a selection controller configured to generate the selection signal according to a type of the data process.

19. A memory device, comprising:
a logic semiconductor die including a global processor configured to perform a global sub process corresponding to a first portion of a data process of an external device; and
a plurality of memory semiconductor dies, wherein the memory semiconductor dies are stacked with respect to each other and a first memory semiconductor die includes a first local processor configured to perform a local sub process corresponding to a second portion of the data process,
wherein the global processor includes:
a plurality of processing units configured to perform different processes;
an output selector configured to select one of outputs of the processing units as an output signal in response to a selection signal; and
a selection controller configured to generate the selection signal according to a type of the data process.

* * * * *